(12) United States Patent
Homma et al.

(10) Patent No.: US 8,390,134 B2
(45) Date of Patent: Mar. 5, 2013

(54) SEMICONDUCTOR DEVICE HAVING SURFACE PROTECTIVE FILMS ON BOND PAD

(75) Inventors: Takuro Homma, Tokyo (JP); Yoshifumi Takata, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 273 days.

(21) Appl. No.: 12/782,784

(22) Filed: May 19, 2010

(65) Prior Publication Data

US 2010/0295044 A1     Nov. 25, 2010

(30) Foreign Application Priority Data

May 20, 2009    (JP) ................................. 2009-121850

(51) Int. Cl.
     *H01L 23/48*      (2006.01)
     *H01L 23/52*      (2006.01)
     *H01L 29/40*      (2006.01)
     *H01L 23/29*      (2006.01)

(52) U.S. Cl. ........ 257/784; 257/753; 257/761; 257/764; 257/773; 257/786; 257/788; 257/E21.605; 257/E23.01

(58) Field of Classification Search .................... None
See application file for complete search history.

(56) References Cited

U.S. PATENT DOCUMENTS

| | | | |
|---|---|---|---|
| 6,727,590 B2 * | 4/2004 | Izumitani et al. ............. | 257/758 |
| 6,905,768 B2 * | 6/2005 | Tada et al. ..................... | 428/413 |
| 7,189,637 B2 * | 3/2007 | Uchikoshi et al. ............ | 438/623 |
| 2006/0249845 A1 | 11/2006 | Takai et al. | |
| 2008/0217786 A1 * | 9/2008 | Kasaoka et al. .............. | 257/773 |
| 2008/0277705 A1 * | 11/2008 | Takahashi et al. ............ | 257/295 |
| 2009/0206411 A1 * | 8/2009 | Koketsu et al. ............... | 257/368 |

FOREIGN PATENT DOCUMENTS

| | | |
|---|---|---|
| JP | 2006-303452 A | 11/2006 |
| JP | 2007-103593 A | 4/2007 |

* cited by examiner

*Primary Examiner* — N. Drew Richards
*Assistant Examiner* — Michael Jung
(74) *Attorney, Agent, or Firm* — Miles and Stockbridge P.C.

(57) ABSTRACT

To provide: a technique capable of suppressing a titanium nitride film that is exposed at the side surface of an opening from turning into a titanium oxide film even when water permeates the opening over a pad from outside a semiconductor device and thus improving the reliability of the semiconductor device; and a technique capable of suppressing a crack from occurring in a surface protective film of a pad and improving the reliability of a semiconductor device. An opening is formed so that the diameter of the opening is smaller than the diameter of another opening and the opening is included in the other opening. Due to this, it is possible to cover the side surface of an antireflection film that is exposed at the side surface of the other opening with a surface protective film in which the opening is formed. As a result of this, it is possible to form a pad without exposing the side surface of the antireflection film.

8 Claims, 30 Drawing Sheets

SEMICONDUCTOR DEVICE HAVING SURFACE PROTECTIVE FILMS ON BOND PAD

CROSS-REFERENCE TO RELATED APPLICATION

The disclosure of Japanese Patent Application No. 2009-121850 filed on May 20, 2009 including the specification, drawings and abstract is incorporated herein by reference in its entirety.

BACKGROUND OF THE INVENTION

The present invention relates to a semiconductor device and a method of forming the same, in particular, to technology which is effective when applied to a semiconductor device having a pad and the manufacturing technique of the same.

Japanese Patent Laid-Open No. 2007-103593 (Patent Document 1) describes the technology capable of forming an opening of a protective film of a bonding pad for a laminated film including different kinds of metal film without diminution of the protective film and of avoiding the dissolution of the metal film in a step of immersing the metal film in an aqueous solution, such as a dicing step. Specifically, over the conductive film including an aluminum film and an antireflection film, such as a Ti film and a TiN film, deposited on the aluminum film, a protective film is formed. Then, in the protective film, a protective film opening that removes the antireflection film in the lower layer and exposes the aluminum film is formed. At this time, an etching step of removing the antireflection film is performed before the deposition of the protective film so that the removal region of the protective film is located inside the removal region of the antireflection film.

Japanese Patent Laid-Open No. 2006-303452 (Patent Document 2) describes the technology of improving yield in a method of manufacturing a semiconductor device comprising a bonding pad including a wire layer including aluminum. Specifically, over a semiconductor substrate, an uppermost layer wire including an aluminum film is formed and over the uppermost layer wire, an antireflection film is formed. Then, part of the antireflection film is removed by etching. After that, a passivation film is formed, which covers the antireflection film and part of the top of the uppermost layer wire where the antireflection film is not formed and which has an opening that exposes the other part of the uppermost layer wire. Further, the semiconductor substrate is divided into a plurality of semiconductor chips. Through such steps, the antireflection film is not exposed any more in the opening and the elution of the uppermost layer wire due to the cell reaction between the uppermost layer wire and the antireflection film can be suppressed.

SUMMARY OF THE INVENTION

In a semiconductor chip, a semiconductor element, such as a MISFET, is formed over a semiconductor substrate and in the upper layer of the semiconductor element, a wire layer is formed. Then, a bonding pad (referred to as a pad) is formed in the uppermost layer of the wire layer. A semiconductor chip thus configured is, for example, mounted over a wiring board and a terminal formed on the wiring board and the pad formed in the semiconductor chip are connected by, for example, a bonding wire including a gold wire. Then, the semiconductor chip mounted over the wiring board is sealed with a resin material.

In the semiconductor chip, a surface protective film (passivation film) is formed so as to cover the wire layer in the uppermost layer and the pad that is exposed from an opening is formed by forming the opening in part of the surface protective film. The pad includes, for example, a laminated film of an aluminum film and an antireflection film and the antireflection film that is exposed from the opening is removed in order to reduce the contact resistance between the pad and the bonding wire. Because of this, at the surface of the pad that is exposed from the opening of the surface protective film, the aluminum film is exposed and on the other hand, over part of the top of the pad covered with the surface protective film, the antireflection film is formed. This means that the antireflection film is removed at the bottom of the opening formed in the surface protective film, however, at the side surface of the opening, the antireflection film is exposed.

The resin member is formed so as to cover the pad thus configured and water etc. is prevented from permeating the inside of the semiconductor chip including the pad. However, in recent years, a halogen-free member begins to be used as a resin member from the standpoint of environmental protection. Specifically, the collection and recovery of wastes of electric/electronic equipment are defined and further, plastic that includes bromine-based flame retardant is defined as a substance to be removed from separately recovered wastes by the WEEE (Waster Electrical and Electronic Equipment) Directive. Because of this, there is an increasing demand to use a halogen-free member as a resin member, which is a package material to seal a semiconductor chip. The inventors of the present invention have found that there exists a new problem as a result of the use of a halogen-free member as a package material to seal a semiconductor chip as described above, which has not surfaced before. After a semiconductor chip is sealed with resin, an assembling step for a product is performed, and then, a semiconductor device is completed as a product. After that, a voltage application test, in which a voltage is applied to the semiconductor device under a high-temperature (85° C. to 130° C.) and high humidity (85%) environment, is conducted to ensure the reliability of the semiconductor device.

At this time, if a halogen-free member is used as a resin member to seal the semiconductor chip, a defect of the semiconductor chip surfaces. Specifically, a pad is configured by a laminated film of an aluminum film and a titanium nitride film (TiN film), which is an antireflection film, and at the bottom of an opening formed in a surface protective film, the titanium nitride film is removed and the aluminum film is exposed. On the other hand, in the region covered with the surface protective film, a laminated film of an aluminum film and a titanium nitride film is formed. Because of this, at the side surface of the opening formed in the surface protective film, the titanium nitride film, which is an antireflection film, is exposed as a result.

The pad thus configured is sealed with a resin member, however, in a voltage application test in a high-temperature and high-humidity environment, water permeates the opening over the pad through the resin member. If this happens, the titanium nitride film that is exposed at the side surface of the opening chemically reacts with the water that has permeated and a titanium oxide film is formed. The volume of the titanium oxide film is greater than that of the titanium nitride film, and therefore, the volume of the antireflection film that is exposed at the side surface of the opening is increased. If the volume of the antireflection film is increased, an excessive stress is applied to the surface protective film formed over the antireflection film and if the stress increases and exceeds a critical point, a crack occurs in the surface protective film. If a crack occurs in the surface protective film, a large amount of water reaches the aluminum film formed in the lower layer of the surface protective film through the crack and a problem of corrosion of the aluminum film is brought about. If such a phenomenon occurs, the reliability of the semiconductor device is degraded and further, there arise a problem of the defect of the semiconductor chip.

The problem of the occurrence of a crack due to the above-described mechanism has not surfaced when the semiconductor chip is sealed with the conventional resin member that does not use the halogen-free member. However, the inventors of the present invention have newly found that when the semiconductor chip is sealed with a resin member that uses the halogen-free member and the voltage application test is conducted under a high-temperature and high-humidity condition with this configuration, the phenomenon in which a crack occurs in the surface protective film due to the above-described mechanism surfaces.

The present invention has been made in view of the above circumstances and provides a technique capable of suppressing a crack from occurring in a surface protective film and of improving the reliability of a semiconductor device even when a halogen-free member is used as a resin member to seal a semiconductor chip.

The other purposes and the new feature of the present invention will become clear from the description of the present specification and the accompanying drawings.

The following explains briefly the outline of a typical invention among the inventions disclosed in the present application.

An example of a semiconductor device according to a typical embodiment comprises (a) a pad formed in an upper layer of a semiconductor substrate, (b) a first surface protective film in which a first opening is formed over the pad, (c) a second surface protective film in which a second opening is formed over the pad and which is formed over the pad and the first surface protective film, and (d) a resin member formed over the second surface protective film including the inside of the second opening. Then, the pad has (a1) a first conductive film and (a2) an antireflection film formed over the first conductive film. At this time, the second opening is included in an inner region of the first opening and the antireflection film is removed in the inner region of the first opening. Further, the resin member includes a halogen-free member.

In an example of another typical semiconductor device, a semiconductor substrate has a wire formation region and a guard ring formation region. In the wire formation region, (a1) a first pad formed in an upper layer of the semiconductor substrate, (b1) a first surface protective film in which a first opening is formed over the pad, and (c1) a second surface protective film in which a second opening is formed over the first pad and which is formed over the first pad and the first surface protective film are formed. Further, the first pad has (a11) a first conductive film and (a12) an antireflection film formed over the first conductive film. The second opening is included in an inner region of the first opening. The antireflection film is removed in the inner region of the first opening. In the guard ring formation region, (a2) a second pad formed in an upper layer of the semiconductor substrate, (b2) the first surface protective film in which a third opening is formed over the second pad, and (c2) the second surface protective film in which the third opening is embedded and which is formed over the second pad and the first surface protective film are formed. Further, the second pad has (a21) the first conductive film and (a22) the antireflection film formed over the first conductive film. Furthermore, the antireflection film is removed in an inner region of the third opening.

An example of another typical semiconductor device comprises (a) a pad formed in an upper layer of a semiconductor substrate, (b) a first surface protective film in which a first opening is formed over the pad, and (c) a second surface protective film in which a second opening is formed over the pad and which is formed over the pad and the first surface protective film. Further, the pad has (a1) a first conductive film and (a2) an antireflection film formed over the first conductive film. The second opening is included in an inner region of the first opening and the antireflection film is removed in the inner region of the first opening. There exist in the pad a probe contact region to which a probe is contacted and a wire connection region to which a wire is connected. The first opening and the second opening are formed so as to extend from the probe contact region to the wire connection region. Further, the size of the second opening in the wire connection region is smaller than the size of the second opening in the probe contact region.

An example of a method of manufacturing a semiconductor device according to a typical embodiment comprises the steps of (a) forming a first conductive film in an upper layer of a semiconductor substrate, (b) forming an antireflection film over the first conductive film, and (c) forming a pad by patterning the first conductive film and the antireflection film. Then, the method comprises the steps of (d) forming a first surface protective film so as to cover the pad, (e) forming a first opening that exposes part of the pad in the first surface protective film by patterning the first surface protective film, and (f) removing the antireflection film that is exposed from the first opening. Further, the method comprises the steps of (g) forming a second surface protective film over the first surface protective film including the inside of the first opening and (h) forming a second opening that exposes part of the pad and which is included in the first opening in the second surface protective film by patterning the second surface protective film. Following the above, the method comprises a step of (i) forming a resin member so as to cover the second surface protective film in which the second opening is formed. Here, the resin member formed in the (i) step is a halogen-free member.

An example of another typical method of manufacturing a semiconductor device comprises the steps of (a) forming a first conductive film in an upper layer of a semiconductor substrate, (b) forming an antireflection film over the first conductive film, (c) forming a pad by patterning the first conductive film and the antireflection film, (d) forming a first surface protective film so as to cover the pad, (e) forming a first opening that exposes part of the pad in the first surface protective film by patterning the first surface protective film, (f) removing the antireflection film that is exposed from the first opening, (g) forming a second surface protective film over the first surface protective film including the inside of the first opening, (h) forming a second opening that exposes part of the pad and which is included in the first opening in the second surface protective film by patterning the second surface protective film, and (i) etching the surface of the pad that is exposed from the second opening.

An example of another typical method of manufacturing a semiconductor device comprises the steps of (a) forming a first conductive film in a region of a semiconductor substrate having a wire formation region in which a wire is formed and a guard ring formation region in which a guard ring is formed, (b) forming an antireflection film over the first conductive film, (c) forming a first pad in the wire formation region and forming a second pad in the guard ring formation region by patterning the first conductive film and the antireflection film, (d) forming a first surface protective film so as to cover the first pad and the second pad, (e) forming a first opening that exposes part of the first pad and a third opening that exposes part of the second pad in the first surface protective film by patterning the first surface protective film, (f) removing the antireflection film that is exposed from the first opening and the antireflection film that is exposed from the third opening, (g) forming a second surface protective film over the first surface protective film including the inside of the first opening and the inside of the third opening, and (h) forming a second opening that exposes the first pad and which is included in the first opening in the second surface protective film by patterning the second surface protective film and at the same time, leaving the third opening embedded with the second surface protective film.

An example of another typical method of manufacturing a semiconductor device comprises the steps of (a) forming a first conductive film in an upper layer of a semiconductor substrate, (b) forming an antireflection film over the first conductive film, (c) forming a pad by patterning the first conductive film and the antireflection film, (d) forming a first surface protective film so as to cover the pad, (e) forming a first opening that exposes part of the pad in the first surface protective film by patterning the first surface protective film, (f) removing the antireflection film that is exposed from the first opening, (g) forming a second surface protective film over the first surface protective film including the inside of the first opening, and (h) forming a second opening that exposes part of the pad and which is included in the first opening in the second surface protective film by patterning the second surface protective film. Further, there exist in the pad, a probe contact region to which a probe is contacted and a wire connection region to which a wire is connected. The first opening and the second opening are formed so as to extend from the probe contact region to the wire connection region. The size of the second opening in the wire connection region is smaller than the size of the second opening in the probe contact region.

The following explains briefly the effect acquired by the typical invention among the inventions disclosed in the present application.

It is possible to improve reliability of a semiconductor device.

DETAILED DESCRIPTION OF THE PREFERRED EMBODIMENTS

The following embodiments will be explained, divided into plural sections or embodiments, if necessary for convenience. Except for the case where it shows clearly in particular, they are not mutually unrelated and one has relationships such as a modification, details, and supplementary explanation of some or entire of another.

In the following embodiments, when referring to the number of elements, etc. (including the number, a numeric value, an amount, a range, etc.), they may be not restricted to the specific number but may be greater or smaller than the specific number, except for the case where they are clearly specified in particular and where they are clearly restricted to a specific number theoretically.

Furthermore, in the following embodiments, it is needless to say that an element (including an element step etc.) is not necessarily indispensable, except for the case where it is clearly specified in particular and where it is considered to be clearly indispensable from a theoretical point of view, etc.

Similarly, in the following embodiments, when shape, position relationship, etc. of an element etc. is referred to, what resembles or is similar to the shape substantially shall be included, except for the case where it is clearly specified in particular and where it is considered to be clearly not right from a theoretical point of view. This statement also applies to the numeric value and range described above.

In all the drawings for explaining embodiments, the same symbol is attached to the same member, as a principle, and the repeated explanation thereof is omitted. In order to make a drawing intelligible, hatching may be attached even if it is a plan view.

First Embodiment

Before explaining a semiconductor device in a first embodiment, a new problem found by the inventors of the present invention is explained with reference to the drawings.

Figure 1:
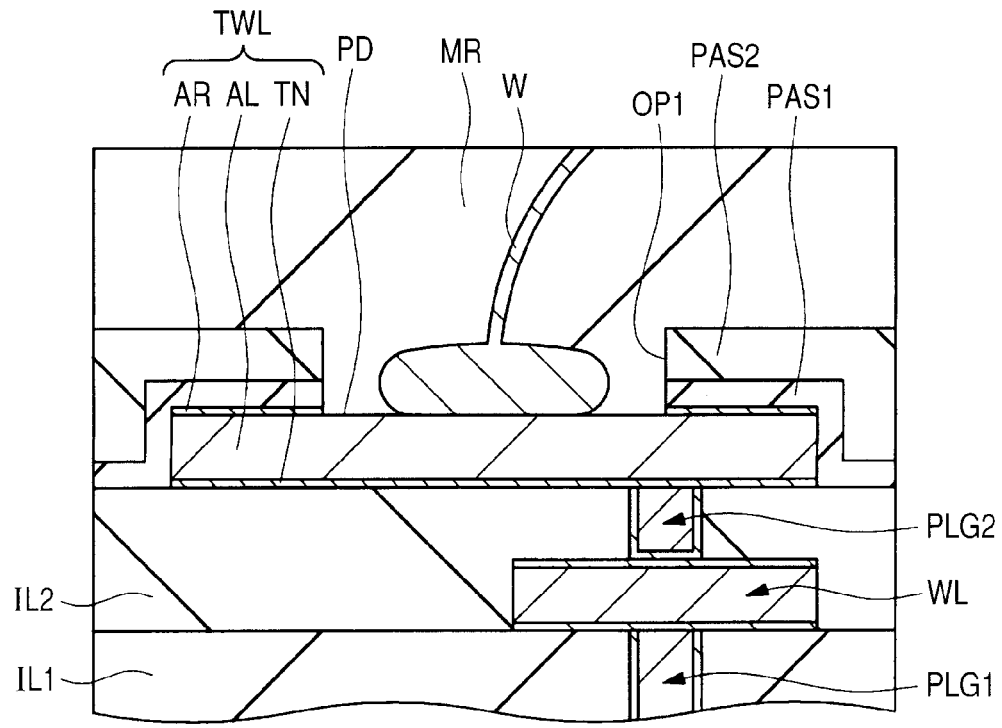
FIG. 1 is a section view showing a region that includes a pad formed in a conventional semiconductor chip.

FIG. 1 is a section view showing a region that includes a pad formed in a conventional semiconductor chip. In FIG. 1, over a semiconductor substrate, not shown schematically, a semiconductor element, such as a MISFET (Metal Insulator Semiconductor Field Effect Transistor), is formed, and over the MISFET, a multilayer wire is formed. FIG. 1 shows a part in the vicinity of the uppermost layer of the multilayer wire. In FIG. 1, a plug PLG1 is formed in an interlayer insulating film IL1 and over the interlayer insulating film IL1 in which the plug PLG1 is formed, a wire WL is formed. The wire WL is electrically coupled with the plug PLG1. Then, over the interlayer insulating film IL1 over which the wire WL is formed, an interlayer insulating film IL2 is formed, and a plug PLG2 is formed in the interlayer insulating film IL2. The plug PLG2 is electrically coupled with the wire WL. Then, over the interlayer insulating film IL2 in which the plug PLG2 is formed, an uppermost layer wire TWL is formed. The uppermost layer wire TWL is electrically coupled with the plug PLG2 and includes, for example, a laminated film of a titanium nitride film TN, an aluminum film AL and an antireflection film AR. At this time, the antireflection film AR includes, for example, a titanium nitride film.

Over the uppermost layer wire TWL thus configured, a surface protective film PAS1 including, for example, a silicon oxide film, and a surface protective film PAS2 including, for example, a silicon nitride film, are formed. Then, an opening OP1 is formed, which penetrates through the surface protective film PAS1 and the surface protective film PAS2 and reaches the uppermost layer wire TWL. In the opening OP1, the antireflection film AR, which is a component of the uppermost layer wire TWL, is removed. That is, at the bottom of the opening OP1 formed in the surface protective film PAS1 and the surface protective film PAS2, the aluminum film AL constituting the uppermost layer wire TWL is exposed. Of the uppermost layer wire TWL, the bottom of the opening OP1 at which the aluminum film AL is exposed forms a pad PD.

To the pad PD, for example, a wire W made of gold wire is connected and in order to reduce the contact resistance between the pad PD and the wire W, the antireflection film AR of the uppermost layer wire TWL is removed in the pad PD formation region. A resin MR is formed so as to cover the inside of the opening OP1 including the pad PD to which the wire W is connected and the surface of the surface protective film PAS2.

For the semiconductor device configured as described above, after the product is completed, a voltage application test, in which a voltage is applied to the semiconductor device in a high temperature (85° C. to 130° C.) and high humidity (85%) environment, is conducted in order to ensure the reliability of the semiconductor device. At this time, it has been made clear that the conventional semiconductor device having the structure shown in FIG. 1 has a problem.

Figure 2:
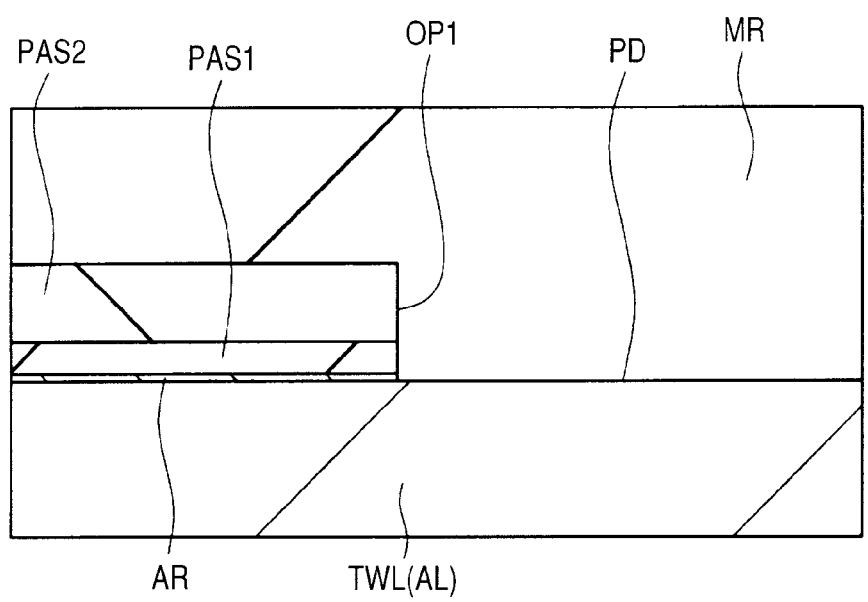
FIG. 2 is a section view showing a part in the vicinity of a pad formation region, also a diagram for explaining a problem of the prior art.
Figure 3:
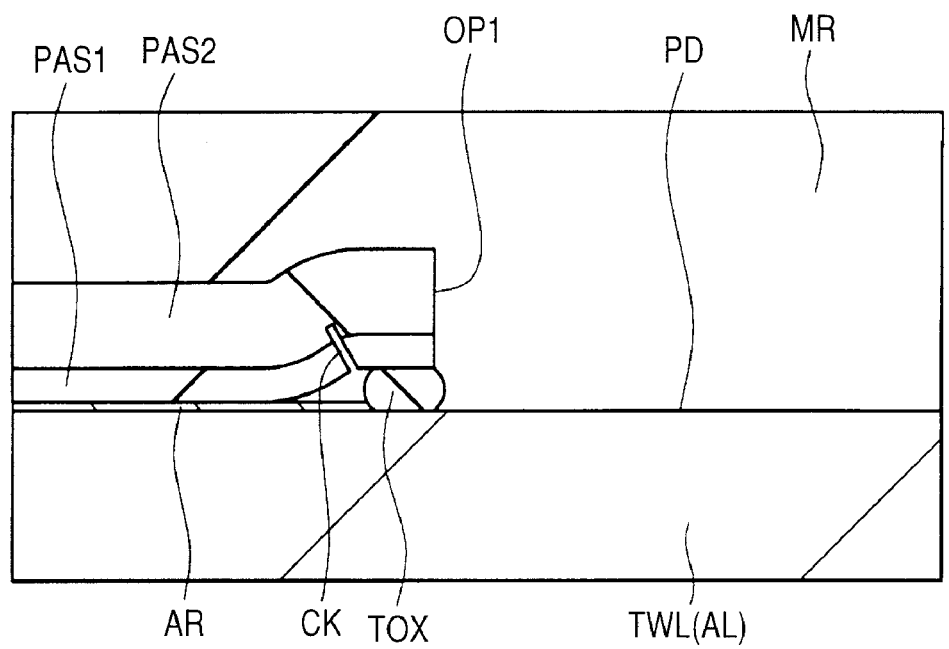
FIG. 3 is a section view showing a part in the vicinity of a pad formation region, also a diagram for explaining a problem of the prior art.

This problem is explained. FIG. 2 is a section view showing a part in the vicinity of the pad PD formation region. In FIG. 2, the region that is exposed at the bottom of the opening OP1 of the uppermost layer wire TWL forms the pad PD. In the pad PD, the antireflection film AR is removed and the aluminum film AL formed in the lower layer of the antireflection film AR is exposed. On the other hand, outside the opening OP1, the surface protective film PAS1 and the surface protective film PAS2 cover the surface of the uppermost layer wire TWL. In this covered region, the antireflection film AR is not removed and still remains. That is, while the antireflection film AR remains in the lower layer of the surface protective film PAS1 outside the opening OP1, inside the opening OP1 where the bottom of the opening OP1 is exposed, it is removed. Because of this, at the side surface of the opening OP1, the side surface of the antireflection film AR is exposed. In this state, the top of the surface protective film PAS2 including the inside of the opening OP1 is covered with the resin MR.

Figure 4:
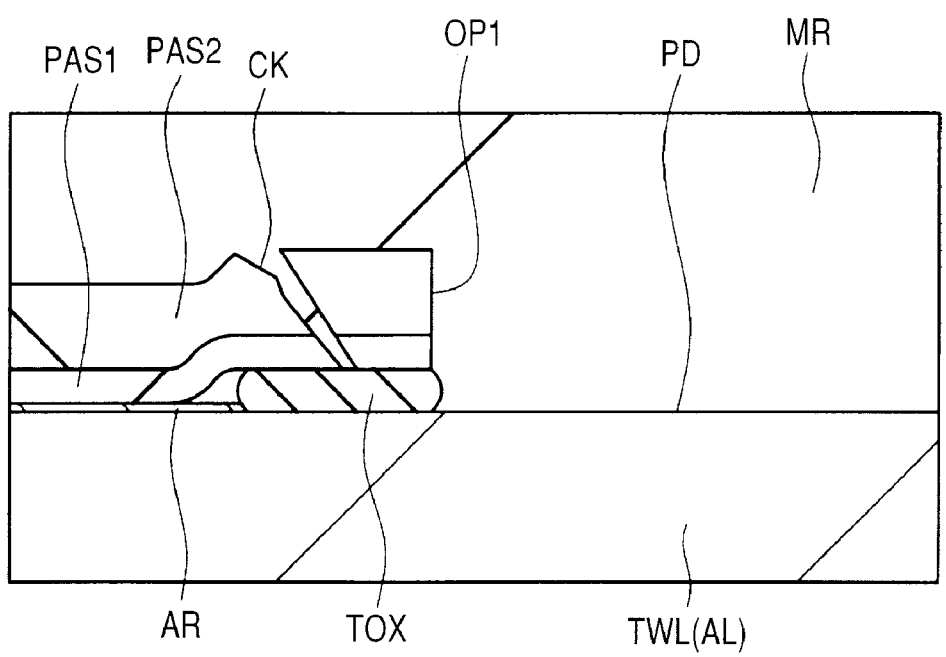
FIG. 4 is a section view showing a part in the vicinity of a pad formation region, also a diagram for explaining a problem of the prior art.

In this state, when the voltage application test is conducted for the semiconductor device in a high-temperature and high-humidity environment, water that exists outside the semiconductor device permeates the inside of the semiconductor device via the resin MR. In particular, the inside of the opening OP1 sealed with the resin MR is concave, and therefore, water that has permeated through the resin MR is likely to gather at the corner part of the opening OP1. If water gathers at the corner part of the opening OP1, the antireflection film AR exposed at the side surface of the opening OP1 comes into direct contact with water as a result. The antireflection film AR includes, for example, a titanium nitride film, and therefore, the titanium nitride film exposed at the side surface of the opening OP1 chemically reacts with water that has permeated and a titanium oxide film TOX is formed. The volume of the titanium oxide film TOX is greater than that of the titanium nitride film, and therefore, the antireflection film AR exposed at the side surface of the opening OP1 expands in volume (a very small crack CK occurs). Further, as shown in FIG. 4, as the chemical reaction progresses from the titanium nitride film to the titanium oxide film, the antireflection film AR expands in volume further. As a result of that, an excessive stress is applied to the surface protective film formed over the antireflection film AR and when the stress exceeds a critical point, the large crack CK occurs across the surface protective film PAS1 and the surface protective film PAS2.

When the large crack CK occurs across the surface protective film PAS1 and the surface protective film PAS2 as described above, water also permeates the uppermost layer wire TWL originally covered with the surface protective film PAS1 and the surface protective film PAS2. Because of this, the corrosion of the aluminum film AL constituting the uppermost layer wire TWL advances, resulting in a defect of the semiconductor chip. Further, a defect is likely to occur, in which the antireflection film AR peels off the surface protective film PAS.

It can be thought that a defect of the semiconductor chip occurs by the mechanism described above, however, in the conventional structure in which a halogen-free member is not used in the resin MR, such a problem has not surfaced. However, the inventors of the present invention have newly found that when the halogen-free member is used in the resin MR, the defect of the semiconductor chip by the mechanism described above surfaces. That is, if the material of the resin is changed to the halogen-free member, it becomes easy for the defect of the semiconductor chip by the above-described mechanism to occur.

In recent years, the halogen-free member begins to be used as the resin MR from the standpoint of environmental protection. Specifically, the collection and recovery of wastes of electric/electronic equipment are defined and further, plastic that includes bromine-based flame retardant is defined as a substance to be removed from separately recovered wastes by the WEEE Directive. Because of this, there is an increasing demand to use the halogen-free member as a resin member, which is a package material to seal a semiconductor chip. Because of this, it can be thought that, from now on, the resin MR including the halogen-free member is used more frequently as a resin to seal a semiconductor device. When the halogen-free member is used frequently as the resin MR, it is expected that the defect of a semiconductor chip by the above-mentioned mechanism cannot be ignored.

Because of this, the present first embodiment provides a technical concept capable of alleviating the defect of the semiconductor chip by the above-described mechanism even when the halogen-free member is used as the resin MR to seal the semiconductor chip. Specifically, in the present first embodiment, the structure of the pad is devised so that the defect of the semiconductor chip does not become worse even if the halogen-free member is used as the resin MR. The technical concept of the present first embodiment in which the above-mentioned devising can be seen is explained below with reference to the drawings.

Figure 5:
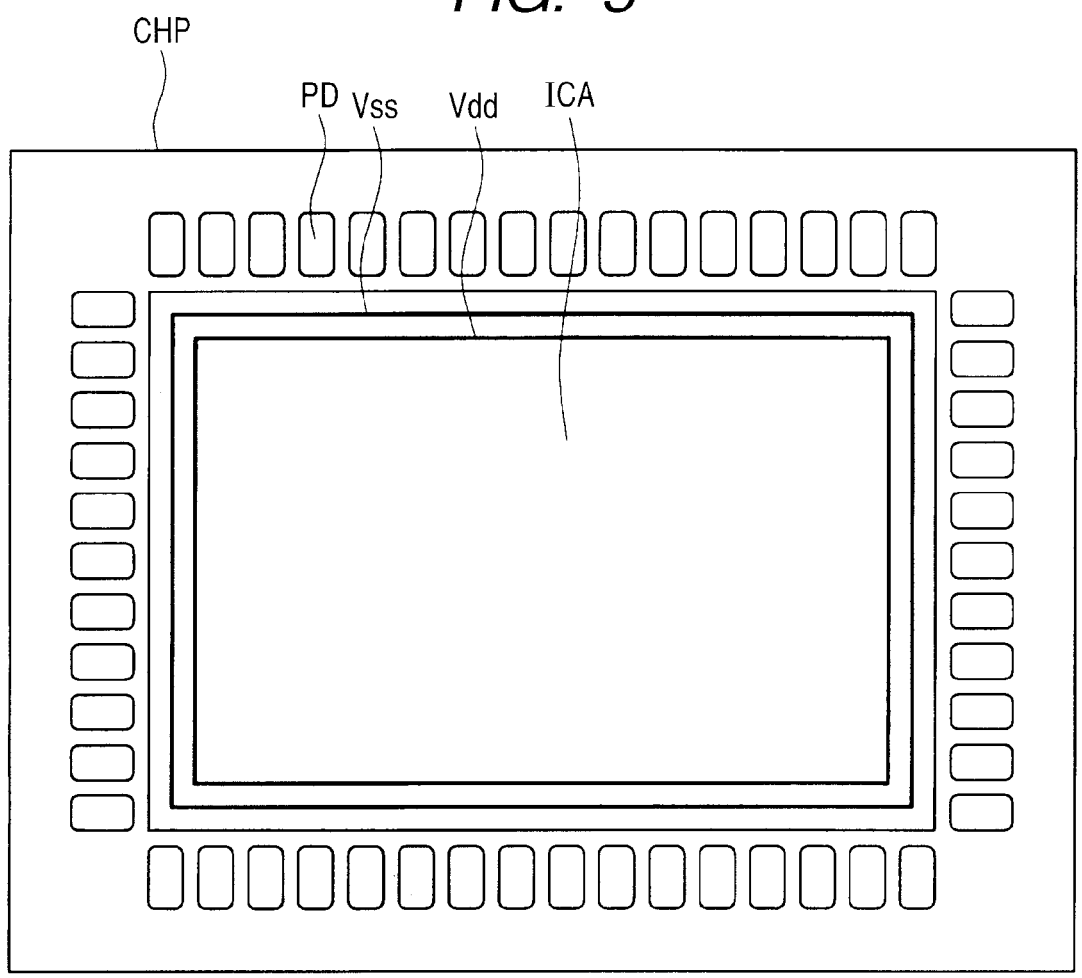
FIG. 5 is a diagram showing a layout configuration of a semiconductor chip in a first embodiment.

FIG. 5 is a diagram showing a planar layout configuration of a semiconductor chip CHP in the present first embodiment. In FIG. 5, the semiconductor chip CHP has a rectangular shape and a plurality of the pads PD is formed along the four sides of the semiconductor chip CHP. Inside the semiconductor chip CHP, an internal circuit region ICA is arranged. The internal circuit region ICA receives a power source or a signal from the pads PD via an I/O region (not shown schematically). The I/O region is arranged within the internal circuit region ICA or in a region under the pad PD. On the periphery of the internal circuit region ICA, a reference power source wire Vss and a power source wire Vdd are arranged in an annular form.

Figure 6:
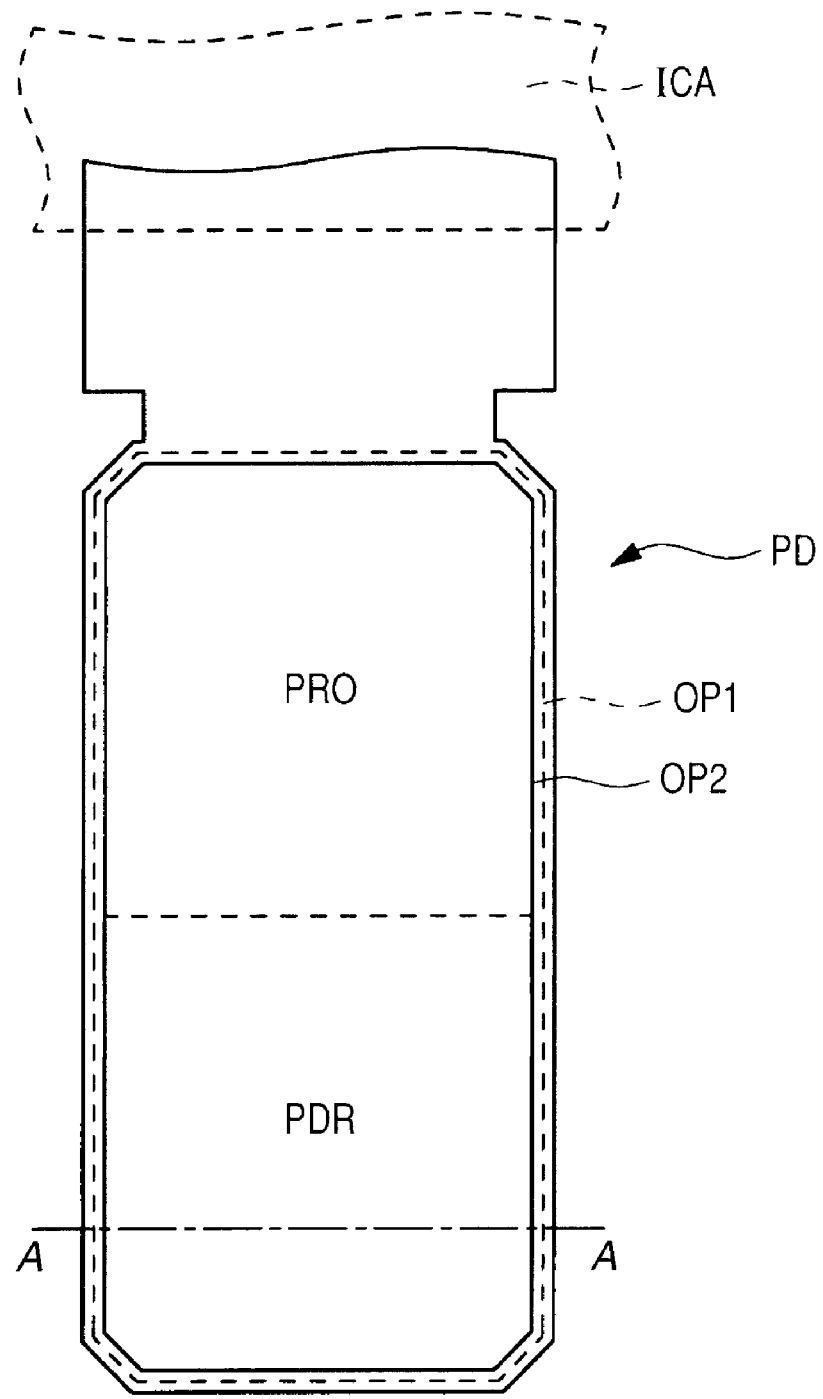
FIG. 6 is a diagram showing a configuration of a pad in the first embodiment.

FIG. 6 is an enlarged view of the pad PD in FIG. 5. The surface of the pad PD is exposed by the opening OP2. Further, there exist a probe contact region PRO to which a probe is contacted in an electrical characteristic inspection and a wire connection region PDR to which a wire is connected in a wire bonding step. Furthermore, the pad PD is formed by the uppermost layer wire and electrically coupled by a wire in the same layer toward the internal circuit region ICA.

Figure 7:
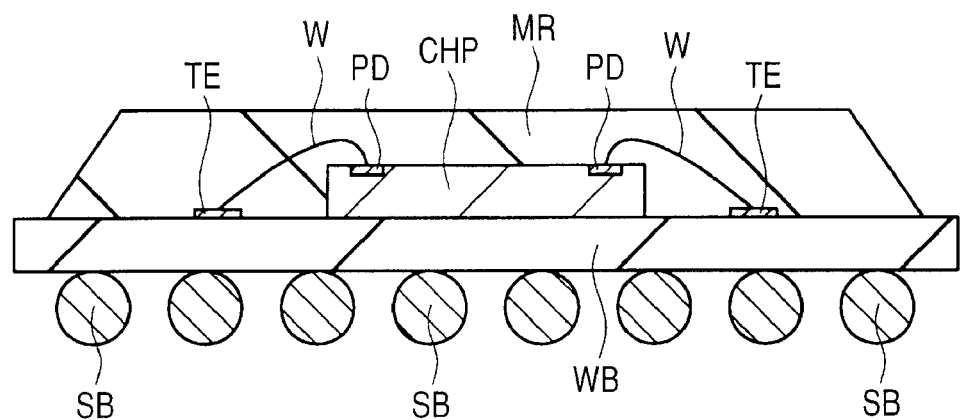
FIG. 7 is a section view showing a semiconductor device in the first embodiment.

FIG. 7 is a section view showing a semiconductor device in the present first embodiment. As shown in FIG. 7, in the semiconductor device in the present first embodiment, the semiconductor chip CHP is mounted over a wiring board WB. Then, the pad PD formed in the semiconductor chip CHP and a terminal TE formed over the wiring board WB are connected by the wire W. The terminal TE formed on the surface (main surface) of the wiring board WB is electrically coupled with a solder ball SB formed on the backside of the wiring board WB. The solder ball SB formed on the backside of the wiring board WB is a member that functions as an external connection terminal and the solder ball SB and the pad PD formed in the semiconductor chip CHP are electrically coupled via the wire W and the terminal TE. Then, the pad PD formed in the semiconductor chip CHP is electrically coupled with a semiconductor element, such as a MISFET formed over the semiconductor substrate, via the multilayer wire formed inside the semiconductor chip CHP. Because of this, an integrated circuit formed inside the semiconductor chip CHP is connected with the pad PD and further, the pad PD is connected with the solder ball (external connection terminal) formed on the backside of the wire board WB via the wire W and the terminal TE, and therefore, the integrated circuit formed inside the semiconductor chip CHP is connected with the solder ball SB, which is an external connection terminal. Because of this, it is made possible to control the integrated circuit formed inside the semiconductor chip CHP from an external device connected to the external connection terminal.

In the present first embodiment, the halogen-free member is used as the material of the wiring board WB. The halogen-free member is used as the wiring board WB as described above because the standpoint of environmental protection is taken into consideration. Here, the halogen-free member used as the wiring board WB is defined as a material having a chlorine content of 0.09 weight percent or less and a bromine content of 0.09 weight percent or less, and the total content of chlorine and bromine is 0.15 weight percent or less.

Next, on the main surface side of the wiring board WB that mounts the semiconductor chip, the resin MR is formed so as to seal the semiconductor chip CHP. The resin MR is provided in order to protect the semiconductor chip CHP from an external impact and permeation of impurities. As the material that constitutes the resin MR, the halogen-member is used because of the importance of the recent environmental protection. At this time, the definition of the halogen-free member that constitutes the resin MR is somewhat different from the definition of the halogen-free member that constitutes the wiring board WB. The halogen-free member used in the wiring board WB is a material having a chlorine content of 0.09 weight percent or less and a bromine content of 0.09 weight percent or less, and the total content of chlorine and bromine is 0.15 weight percent or less as described above. In contrast to this, the halogen-free member used in the resin MR is defined as a material having a chlorine content of 0.09 weight percent or less, a bromine content of 0.09 weight percent or less, and an antimony content of 0.09 weight percent or less. In either case, in the semiconductor device in the present first embodiment, the halogen-free member is used as the material that constitutes the wiring board WB and the material that constitutes the rein MR, that is, a material that does not contaminate the environment is used as a result. That is, the material of the wiring board WB and the resin MR used in the present specification is the material specified by the above-described WEEE Directive.

Figure 8:
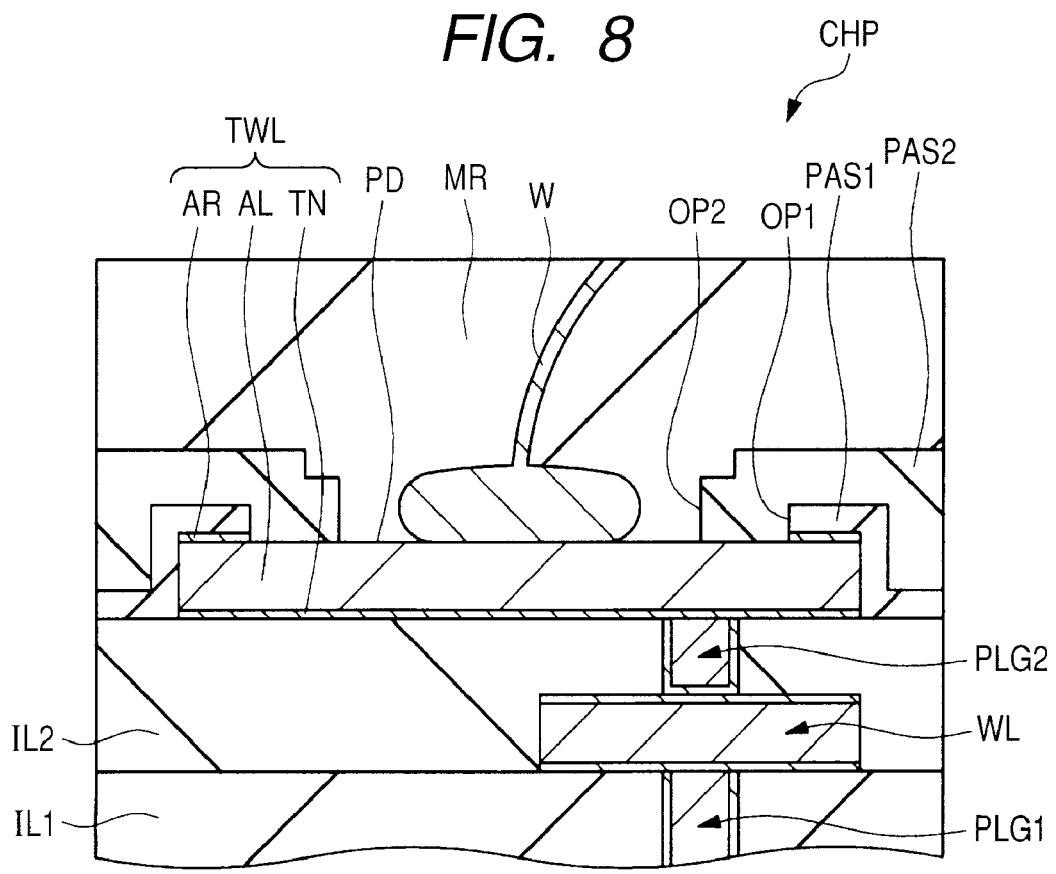
FIG. 8 is a section view showing a part in the vicinity of a pad formation region formed in a semiconductor chip in the first embodiment.

Next, a structure in the vicinity of the pad PD of the semiconductor chip CHP is explained with reference to FIG. 8. FIG. 8 is a section view showing a structure in the vicinity of the pad PD of the semiconductor chip CHP and a section view corresponding to the A-A section in FIG. 6. First, in the semiconductor chip CHP, a semiconductor element, such as a MISFET (including a logic IC and memory), is formed over a plate-shaped semiconductor substrate and over the semiconductor substrate over which the semiconductor element is formed, the multilayer wire is formed by an interlayer insulating film. In FIG. 8, the uppermost layer wire and the wire in the layer lower by one layer of the multilayer wire are shown.

In FIG. 8, in the interlayer insulating film IL1, the plug PLG1 is formed. The interlayer insulating film IL1 is formed by, for example, a silicon oxide film, and the plug PLG1 is formed by embedding a conductive film in a contact hole formed in the interlayer insulating film IL1. Specifically, on the inner wall of the contact hole, a barrier conductive film, such as a titanium film and a titanium nitride film, is formed and over the barrier conductive film, a metal film, such as a tungsten film and an aluminum film, is embedded, and thus, the plug PLG1 is formed. The barrier conductive film is a film having so-called barrier properties to prevent, for example, a metal film, which is a material of a film to be embedded in the contact hole in a subsequent step, from diffusing into silicon. The plug PLG1 thus configured is electrically coupled with the semiconductor element, such as a MISFET formed over the semiconductor substrate, via the wire in the lower layer.

Next, over the interlayer insulating film IL1 in which the plug PLG1 is formed, the wire WL is formed and the interlayer insulating film IL2 is formed so as to cover the wire WL. The wire WL is formed by, for example, a laminated film of a titanium/titanium nitride film, an aluminum film, and a titanium/titanium nitride film. Then, the interlayer insulating film IL2 is formed by, for example, a silicon oxide film, like the interlayer insulating film IL1. In the interlayer insulating film IL2, the plug PLG2 that reaches the wire WL is formed and like the plug PLG1, the plug PLG2 is formed by embedding a metal film in a contact hole (through hole) via a barrier conductive film.

In the present embodiment, a wire structure that mainly includes an aluminum film is shown as an example, however, the structure is not limited to this. For example, a wire structure of a dual damascene structure including copper as its main component may be employed. In that case, only the pad PD in the same layer as the uppermost layer wire has an aluminum wire structure, however, all of the wires in the lower layers have a wire structure of a dual damascene structure including copper as its main component. In the case of the wire structure of a dual damascene structure, a wire groove and a connection hole are formed within the interlayer insulating film IL1. After that, a conductor film including copper as its main component is formed in the wire groove and the connection hole by the plating method and the conductive film of the outside of the wire groove and the outside of the connection hole is polished by the CMP method etc. Due to this, it is possible to form a wire structure of a dual damascene structure in which the wire WL and the plug PLG1 are formed integrally in the wire groove and the connection hole. It may also be possible to form a barrier metal film having a function to prevent copper from diffusing between the interlayer insulating film IL1 and the conductive film. The barrier metal includes, for example, tantalum nitride, tantalum, or a laminated film made of them.

Following the above, over the interlayer insulating film IL2 in which the plug PLG2 is formed, the uppermost layer wire TWL is formed. The uppermost layer wire TWL is electrically coupled with the wire WL via the plug PLG2. At this time, the wire WL is connected with the semiconductor element via the plug PLG1 and the lower layer wire, and therefore, the uppermost layer wire TWL is electrically coupled with the semiconductor element as a result, and therefore, by electrically coupling the semiconductor element and the multilayer wire including the uppermost wire, the integrated circuit is formed in the semiconductor chip CHP.

The uppermost layer wire TWL is formed by, for example, a laminated film of the titanium film TN, the aluminum film AL formed over the aluminum film AL, and the antireflection film AR formed over titanium film TN. Then, over the uppermost layer wire TWL, the surface protective film (passivation film) PAS1 is formed and over the surface protective film PAS1, the surface protective film PAS2 is formed. The surface protective film PAS1 is formed by, for example, a silicon oxide film and the surface protective film PAS2 is formed by, for example, a silicon nitride film.

Next, the configuration of the pad PD formed by opening part of the uppermost layer wire TWL is explained. As shown in FIG. 8, the opening OP1 is formed in the surface protective film PAS1 formed over the uppermost layer wire TWL. That is, the opening OP1 that penetrates through the surface protective film PAS1 and exposes the uppermost layer wire TWL at the bottom is formed in the surface protective film PAS1. The antireflection film AR that is exposed at the bottom of the opening OP1 is removed. Because of this, at the bottom of the opening OP1 formed in the surface protective film PAS1, the aluminum film AL constituting the uppermost layer wire TWL is exposed. That is, at the bottom located inside the opening OP1, the antireflection film AR constituting part of the uppermost layer wire TWL is removed and the aluminum film AL is exposed. On the other hand, outside the opening OP1, the antireflection film AR remains in the lower layer of the surface protective film PAS1. Because of this, at the side surface of the opening OP1, which is a boundary between the outside and the inside of the opening OP1, the side surface of the antireflection film AR is exposed as a result.

Following the above, over the surface protective film PAS1, the surface protective film PAS2 is formed and in the surface protective film PAS2, an opening OP2 is formed. The opening OP2 is formed so as to be included in the opening OP1. That is, the size of the opening OP2 is smaller than the size of the opening OP1 and inside the opening OP1, part of the surface protective film PAS2 is formed. Specifically, the opening OP2 formed in the surface protective film PAS2 is smaller than the opening OP1 formed in the surface protective film PAS1 and the opening OP2 is included in the opening OP1, and therefore, the side surface of the opening OP1 is covered with the surface protective film PAS2 as a result. Then, at the bottom of the opening OP2 formed in the surface protective film PAS2, the aluminum film AL constituting the uppermost layer wire TWL is exposed and the pad PD defined by the size of the opening OP2 is formed. That is, in the present first embodiment, the diameter of the opening OP1 formed in the surface protective film PAS1 differs from the diameter of the opening OP2 formed in the surface protective film PAS2, and therefore, only the bottom of the opening OP2 the diameter of which is smaller is exposed and by the uppermost layer wire TWL that is exposed at the bottom of the opening OP2, the pad PD is formed.

To the pad PD, the wire W is connected and the top of the surface protective film PAS2 that includes the top of the pad PD to which the wire W is connected is sealed with the resin MR.

Here, the characteristic of the present first embodiment is that the diameter of the opening OP1 formed in the surface protective film PAS1 is made to differ from the diameter of the opening OP2 formed in the surface protective film PAS2. Further, the specific characteristic of the present first embodiment is that the diameter of the opening OP2 is made smaller than the diameter of the opening OP1 and the opening OP2 is formed so as to be included in the opening OP1. Due to this, it is possible to cover the side surface of the antireflection film AR exposed at the side surface of the opening OP1 with the surface protective film PAS2 in which the opening OP2 is formed. That is, the opening OP2 is formed so as to be included in the opening OP1, and therefore, the pad PD is defined by the opening OP2 and the side surface of the opening OP1 is covered with the surface protective film PAS2. As a result of that, it is possible to form the pad PD without exposing the side surface of the antireflection film AR. Due to this, the side surface of the opening OP1 is covered with the surface protective film PAS2 without exposing the antireflection film AR formed at the side surface thereof. Because of this, even if water permeates the corner part of the opening OP2 where the pad PD is exposed, the water that has permeated does not reach the side surface of the opening OP1, and therefore, it is unlikely that the water comes into direct contact with the antireflection film AR formed at the side surface of the opening OP1. Consequently, it is possible to suppress the titanium nitride film, which is the antireflection film AR, from reacting with water to turn into a titanium oxide film. This means that the volume of the antireflection film AR can be suppressed from increasing and the occurrence of a crack resulting from the increase in the volume of the antireflection film AR and the peeling of the antireflection film AR from the surface protective film PAS1 can be suppressed.

That is, the characteristic of the present first embodiment is that the opening OP2 is formed so as to be included in the opening OP1, in other words, the opening OP2 is formed so that the side surface of the antireflection film AR and the side surface of the surface protective film PAS1 are covered with the surface protective film PAS2.

For example, as shown in FIG. 1, when the opening OP2 is formed so that the diameter of the opening OP1 opened in the surface protective film PAS1 is the same as the diameter of the opening OP2 opened in the surface protective film PAS2 and they overlap each other exactly, the side surface of the antireflection film AR is exposed from the side surface of the opening OP1 (the same size as that of the opening OP2) as a result. In this case, if water permeates the corner part of the opening OP1 and gathers there, the water that has gathered comes into direct contact with the antireflection film AR (titanium nitride film) as a result. Then, the water reacts chemically with the titanium nitride film constituting the antireflection film AR and the titanium nitride film turns into a titanium oxide film. The volume of the titanium oxide film is greater than the volume of the titanium nitride film, and therefore, the antireflection film AR expands in volume. As a result of that, a large crack may occur that extends from the surface protective film PAS1 to the surface protective film PAS2 or the antireflection film AR peels off the surface protective film PAS1 because of the volume expansion of the antireflection film AR.

In contrast to this, when the configuration is such that, as in the present first embodiment, the opening OP2 formed in the surface protective film PAS2 is made smaller than the opening OP1 formed in the surface protective film PAS1 and the opening OP2 is included in the opening OP1, it is possible to cover the side surface of the opening OP1 with the surface protective film PAS2. That is, it is possible to cover the side surface of the antireflection film AR that is exposed at the side surface of the opening OP1 with the surface protective film PAS2. Due to this, it is possible to prevent water that permeates the corner part of the opening OP2 from coming into direct contact with the antireflection film AR exposed at the side surface of the opening OP1, and therefore, the antireflection film AR can be suppressed from expanding in volume because of the chemical reaction. As a result of that, the occurrence of a large crack extending from the surface protective film PAS1 to the surface protective film PAS2 and the peeling of the antireflection film AR from the surface protective film PAS1 resulting from the volume expansion of the antireflection film AR can be suppressed. In particular, the occurrence of such a crack and the occurrence of peeling will surface as a defect of a semiconductor chip in a semiconductor device using the halogen-free member as the resin MR, however, the present first embodiment 1 is effective also for a product that uses the halogen-free member as the resin MR by physically separating water that gathers in the pad PD from the antireflection film AR.

In the present first embodiment, by designing the configuration so that the opening OP2 formed in the surface protective film PAS2 is included in the opening OP1 formed in the surface protective film PAS1, water that gathers in the pad PD can be physically separated from the antireflection film AR, and such a configuration can be realized because of the two-layer configuration of the surface protective film PAS1 and the surface protective film PAS2. That is, when the surface protective film is formed as one layer, another opening cannot be formed, and therefore, the antireflection film is exposed from the side surface of the opening and water that permeates the corner part of the opening comes into direct contact with the antireflection film as a result. Because of this, the occurrence of a crack or the occurrence of peeling brings about a problem. In contrast to this, in the present first embodiment, the surface protective film includes two layers, that is, the surface protective film PAS1 and the surface protective film PAS2, and therefore, it is possible to make the opening OP1 to be formed in the surface protective film PAS1 different from the opening OP2 to be formed in the surface protective film PAS2. That is, by configuring the two layers of the surface protective film PAS1 and the surface protective film PAS2, the diameter of the opening OP1 at which the antireflection film AR is exposed can be increased and the opening OP2 can be included in the opening OP1.

The semiconductor device in the present first embodiment is configured as described above and a method of manufacturing the same is explained below with reference to the drawings.

Figure 9:
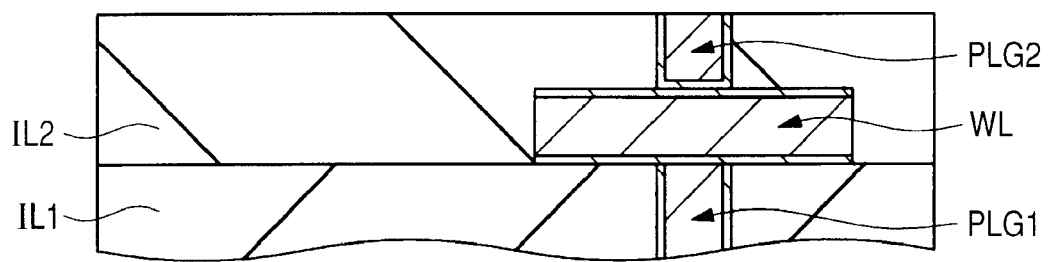
FIG. 9 is a section view showing a manufacturing step of a semiconductor device in the first embodiment.

First, a semiconductor element, such as a MISFET, is formed over a semiconductor substrate by using the normal semiconductor manufacturing technique. Then, a multilayer wire is formed over the semiconductor substrate over which the semiconductor element is formed. FIG. 9 shows part of a wire constituting the multilayer wire. A manufacturing step of the wire is explained. As shown in FIG. 9, the interlayer insulating film IL1 including a silicon oxide film is formed by, for example, the CVD (Chemical Vapor Deposition) method.

Then, by using the photolithography technique and the etching technique, a contact hole (through hole) is formed in the interlayer insulating film IL1. After that, over the interlayer insulating film IL1 including the contact hole, a barrier conductive film including, for example, a titanium/titanium nitride film, and a metal film including, for example, an aluminum film, are formed and the barrier conductive film and the metal film are embedded in the contact hole. Next, the unnecessary barrier conductive film and metal film formed over the interlayer insulating film IL1 are removed by, for example, the CMP (Chemical Mechanical Polishing) method. Due to this, the plug PLG1 embedded in the interlayer insulating film IL1 can be formed.

Following the above, over the interlayer insulating film IL1 in which the plug PLG1 is formed, a laminated film of a titanium/titanium nitride film, an aluminum film, and a titanium/titanium nitride film is formed. The titanium/titanium nitride film and the aluminum film that constitute the laminated film can be formed by using, for example, the sputtering method. After that, by using the photolithography technique and the etching technique, the laminated film formed over the interlayer insulating film IL1 is patterned. Due to this, the wire WL that is connected with the plug PLG1 can be formed over the interlayer insulating film IL1.

Next, over the interlayer insulating film IL1 over which the wire WL is formed, the interlayer insulating film IL2 is formed. The interlayer insulating film IL2 is formed by, for example, a silicon oxide film and can be formed by, for example, the CVD method. Then, by using the photolithography technique and the etching technique, a contact hole (through hole) is formed in the interlayer insulating film IL2. After that, over the interlayer insulating film IL2 including the inside of the contact hole, a barrier conductive film including, for example, a titanium/titanium nitride film, and a metal film including, for example, an aluminum film, are formed and the barrier conductive film and the metal film are embedded in the contact hole. Next, the unnecessary barrier conductive film and metal film formed over the interlayer insulating film IL2 are removed by, for example, the CMP (Chemical Mechanical Polishing) method. Due to this, the plug PLG2 can be formed in the interlayer insulating film IL2. In this manner, part of the multilayer wire shown in FIG. 9 is formed. Next, a step of forming the uppermost layer wire of the multilayer wire is explained.

Figure 10:
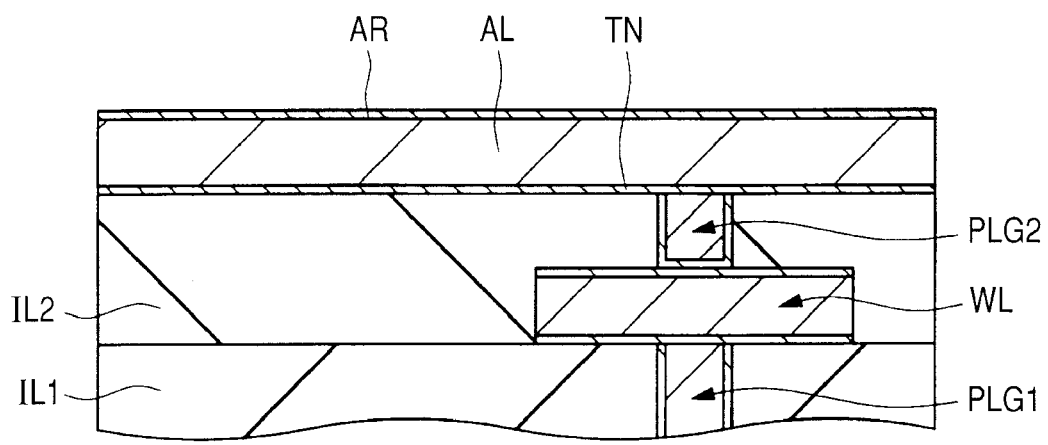
FIG. 10 is a section view showing a manufacturing step of the semiconductor device, following FIG. 9.

First, as shown in FIG. 10, over the interlayer insulating film IL2 in which the plug PLG2 is formed, the titanium nitride film TN is formed. The titanium nitride film TN can be formed by using, for example, the sputtering method. Then, over the titanium nitride film TN, the aluminum film AL is formed. The aluminum film AL can also be formed by using, for example, the sputtering method. Then, over the aluminum film AL, the antireflection film AR is formed. The antireflection film AR is a film provided in order to prevent the precision of exposure of a resist film formed over the aluminum film AL from deteriorating, which is caused by scattering of light reflected from the aluminum film, when a film having a high reflectivity, such as an aluminum film, is patterned. That is, by forming the antireflection film AR over the aluminum film, it is possible to suppress undesired reflection from the aluminum film and to ensure the precision of patterning of a resist film. The antireflection film AR is formed by, for example, a titanium nitride film, and can be formed by, for example, the sputtering method.

The film thickness of each film is, for example, as follows: the film thickness of the titanium nitride film TN is 75 nm, that of the aluminum film AL is 600 to 2,000 nm (preferably, 800 nm to 1,000 nm), and that of the titanium nitride film, which is the antireflection film AR, is about 30 to 100 nm.

Figure 11:
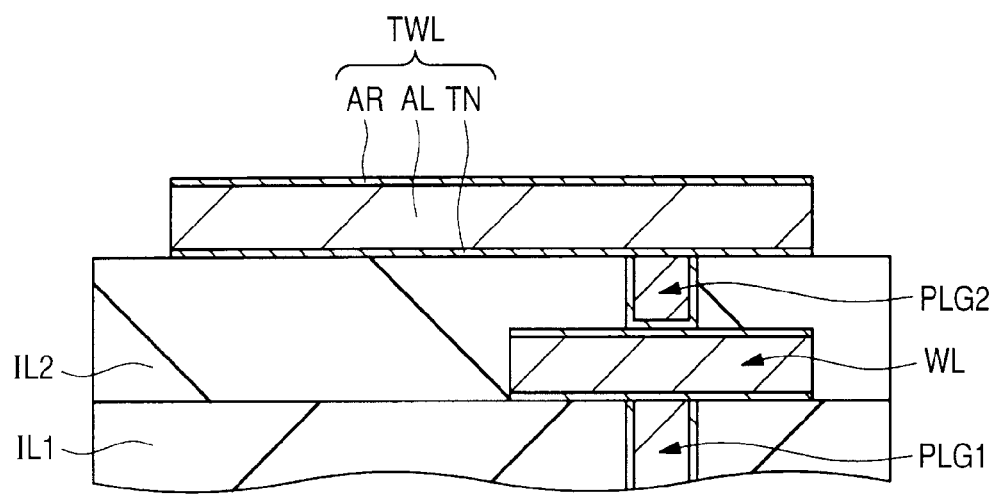
FIG. 11 is a section view showing a manufacturing step of the semiconductor device, following FIG. 10.

Following the above, as shown in FIG. 11, by using the photolithography technique and the etching technique, the titanium nitride film TN, the aluminum film AL and the antireflection film AR are patterned. At this time, a resist film is formed over the antireflection film AR, and the resist film is irradiated with exposure light via a mask, and thus, the resist film is processed. At this time, the antireflection film AR is formed in the lower layer of the resist film, and therefore, the light reflected from the aluminum film AL located in the further lower layer can be suppressed, and therefore, the processing precision of the resist film is improved. As a result of that, it is possible to perform patterning with precision of the titanium nitride film TN, the aluminum film AL and the antireflection film AR using the processed resist film as a mask and to form the uppermost layer wire TWL including the titanium nitride film TN, the aluminum film AL and the antireflection film AR.

Figure 12:
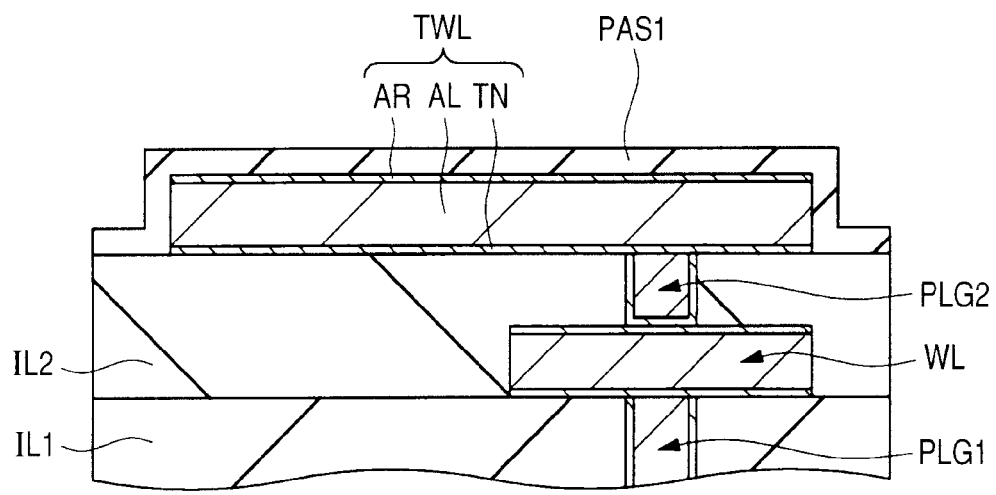
FIG. 12 is a section view showing a manufacturing step of the semiconductor device, following FIG. 11.

Next, as shown in FIG. 12, over the interlayer insulating film IL2 over which the uppermost layer wire TWL is formed, the surface protective film PAS1 is formed. The surface protective film PAS1 is formed so as to cover the uppermost layer wire TWL. The surface protective film PAS1 is formed by, for example, a silicon oxide film, and can be formed by, for example, the plasma CVD method. The surface protective film PAS1 is a film provided in order to protect the semiconductor element and the multilayer wire formed inside the semiconductor substrate from a mechanical stress and permeation of impurities. The film thickness of the surface protective film PAS1 is, for example, about 200 nm.

Figure 13:
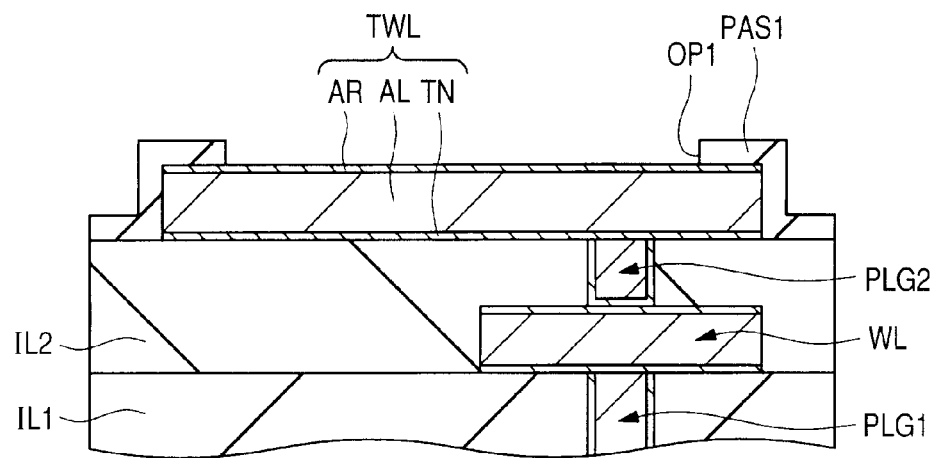
FIG. 13 is a section view showing a manufacturing step of the semiconductor device, following FIG. 12.

After that, as shown in FIG. 13, by using the photolithography technique and the etching technique, the surface protective film PAS1 is patterned. Specifically, the patterning of the surface protective film PAS1 is performed so that the opening OP1 at which part of the surface of the uppermost layer wire TWL is exposed is formed. At this time, the etching of the surface protective film PAS1 including a silicon oxide film is performed using an etching gas including $CHF_3$, $CF_4$, $O_2$ and Ar.

Figure 14:
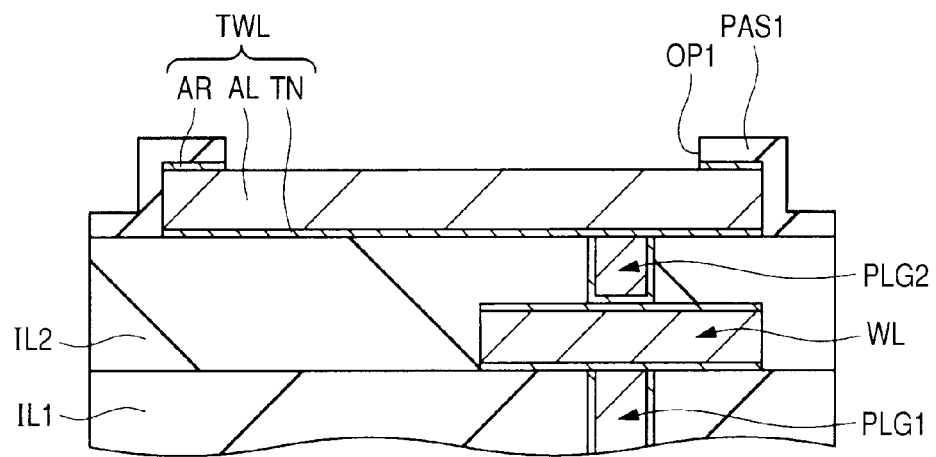
FIG. 14 is a section view showing a manufacturing step of the semiconductor device, following FIG. 13.

Following the above, as shown in FIG. 14, the antireflection film AR that is exposed from the opening OP1 is removed by performing etching. The etching of the antireflection film AR including a titanium nitride film is performed using an etching gas including $Cl_2$ and Ar. The antireflection film AR that is exposed at the bottom of the opening OP1 is removed in order to reduce the contact resistance between a wire including a gold wire and the uppermost layer wire TWL when the wire is connected to the uppermost layer wire TWL in a subsequent step. That is, if the antireflection film AR is not removed, the silicon nitride film comes into contact with the wire, and therefore, the contact resistance is increased. Because of this, the antireflection film AR is removed and the aluminum film is caused to come into contact with the wire and thus the contact resistance is reduced. Further, when the aluminum film is caused to come into direct contact with the wire, the adhesion of the wire is increased.

After the titanium nitride film, which is the antireflection film AR, is removed, anti-corrosion processing using a gas including $H_2O$ and $O_2$ is performed in order to perform anti-corrosion processing on the surface of the aluminum film AL that is exposed. Due to this, a thin aluminum oxide film (not shown schematically) is formed on the surface of the aluminum film AL.

Figure 15:
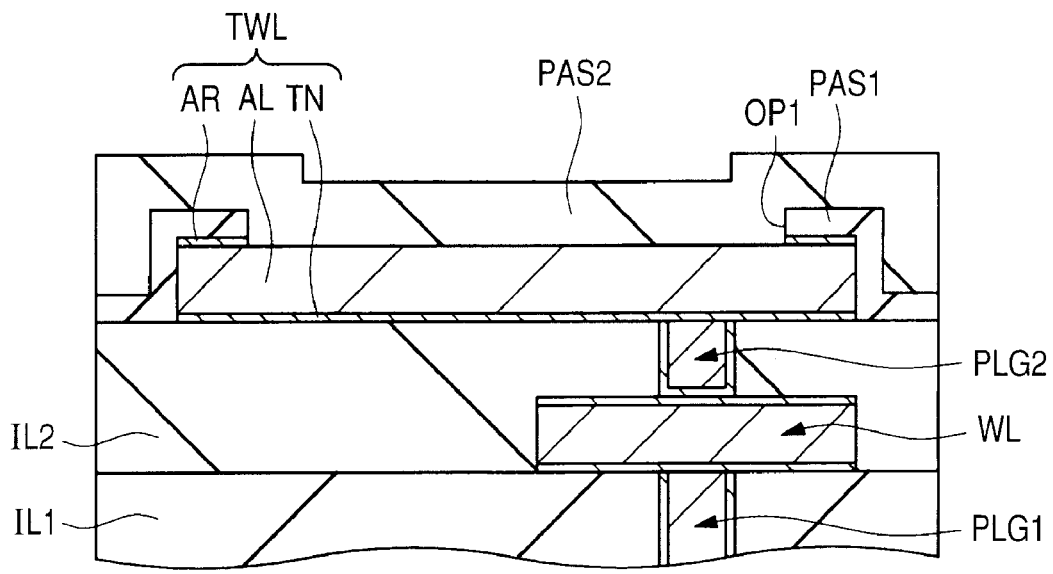
FIG. 15 is a section view showing a manufacturing step of the semiconductor device, following FIG. 14.

Next, as shown in FIG. 15, over the surface protective film PAS1 in which the opening OP1 is formed, the surface protective film PAS2 is formed. The surface protective film PAS2 is formed so that the opening OP1 is embedded therein. The surface protective film PAS2 is formed by, for example, a silicon nitride film, and can be formed by, for example, the plasma CVD method. Like the surface protective film PAS1, the surface protective film PAS2 is a film also provided in order to protect the semiconductor element and the multilayer wire formed inside the semiconductor substrate from a mechanical stress and permeation of impurities. The film thickness of the surface protective film PAS2 is, for example, about 500 to 1,500 nm, preferably, about 600 nm.

Figure 16:
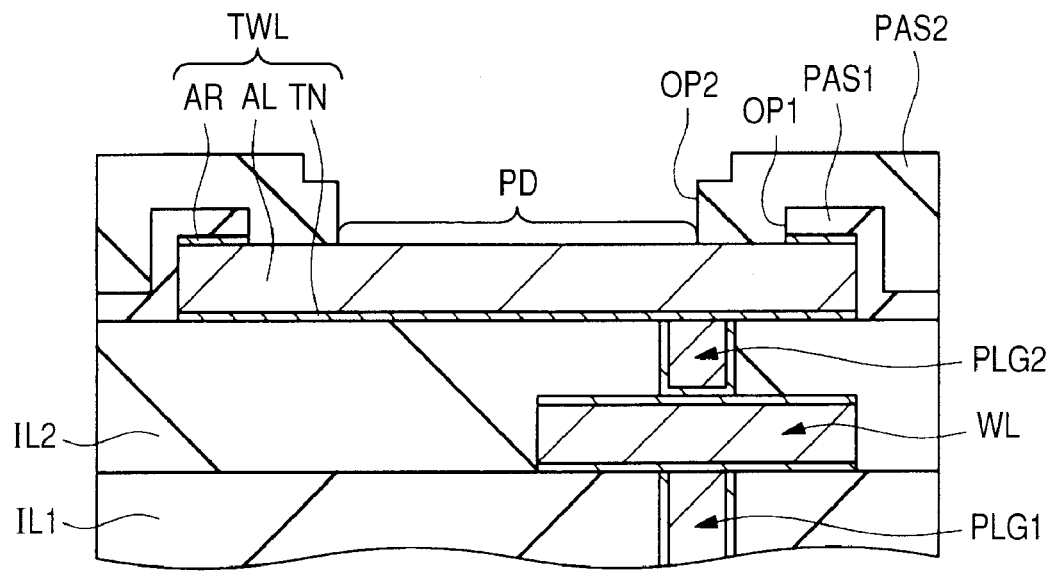
FIG. 16 is a section view showing a manufacturing step of the semiconductor device, following FIG. 15.

After that, as shown in FIG. 16, by using the photolithography technique and the etching technique, the opening OP2 is formed in the surface protective film PAS2. At this time, the opening OP2 is formed so that the size (diameter) of the opening OP2 formed in the surface protective film PAS2 is smaller than the size (diameter) of the opening OP1 formed in the surface protective film PAS1 and the opening OP2 is included in the opening OP1. As a result of that, the antireflection film AR that is exposed at the side surface of the opening OP1 is covered with the surface protective film PAS2. At the bottom of the opening OP2 formed in the surface protective film PAS2, the aluminum film AL constituting the uppermost layer wire TWL is exposed and the region where the aluminum film AL is exposed forms the pad PD. The etching of the surface protective film PAS2 in which the opening OP2 is formed is performed using an etching gas including $CHF_3$, $CF_4$, $O_2$ and Ar. In the manner described above, the pad PD can be formed in the uppermost layer of the multilayer wire.

Further, after the opening OP2 is formed, anti-corrosion processing using a gas including $H_2O$ and $O_2$ is performed in order to perform anti-corrosion processing on the surface of the aluminum film AL that is exposed. Due to this, a thin aluminum oxide film (not shown schematically) is formed on the surface of the aluminum film AL. The anti-corrosion processing explained above in FIG. 14 does not necessarily need to be performed, however, it is desirable to perform anti-corrosion processing without fail because during the period of subsequent steps after the opening OP2 is formed, the semiconductor wafer is left for a long time.

After that, a step of conducting a probe test of the semiconductor wafer is performed. As in the present embodiment, when the wire connection region PDR and the probe contact region are provided in the pad PD, a plurality of probe traces is formed in the probe contact region PRO at the time of the probe test. At this time, the aluminum oxide film on the surface of the aluminum film AL is scraped off. Because of this, in the probe contact region PRO, the aluminum film AL is exposed in the state of being scraped off, and therefore, the possibility that the aluminum film AL undergoes an electrochemical reaction resulting from water that permeates from outside becomes high. Further, the titanium nitride film TN near the probe contact region PRO becomes more likely to be affected to cause abnormal oxidation. The probe contact region PRO is located nearer to the internal circuit region ICA than the wire connection region PDR, and therefore, it is more effective to take measures as in the present embodiment. The configuration in which the wire connection region PDR and the probe contact region PRO are formed in the pad PD may be used similarly in other embodiments. Further, in the present embodiment, the semiconductor chip CHP is connected by wire bonding, and therefore, it is desirable to arrange the wire connection region PDR at a position close to the end part (dicing line that defines the chip region in the stage of semiconductor wafer) of the semiconductor chip CHP.

Figure 17:
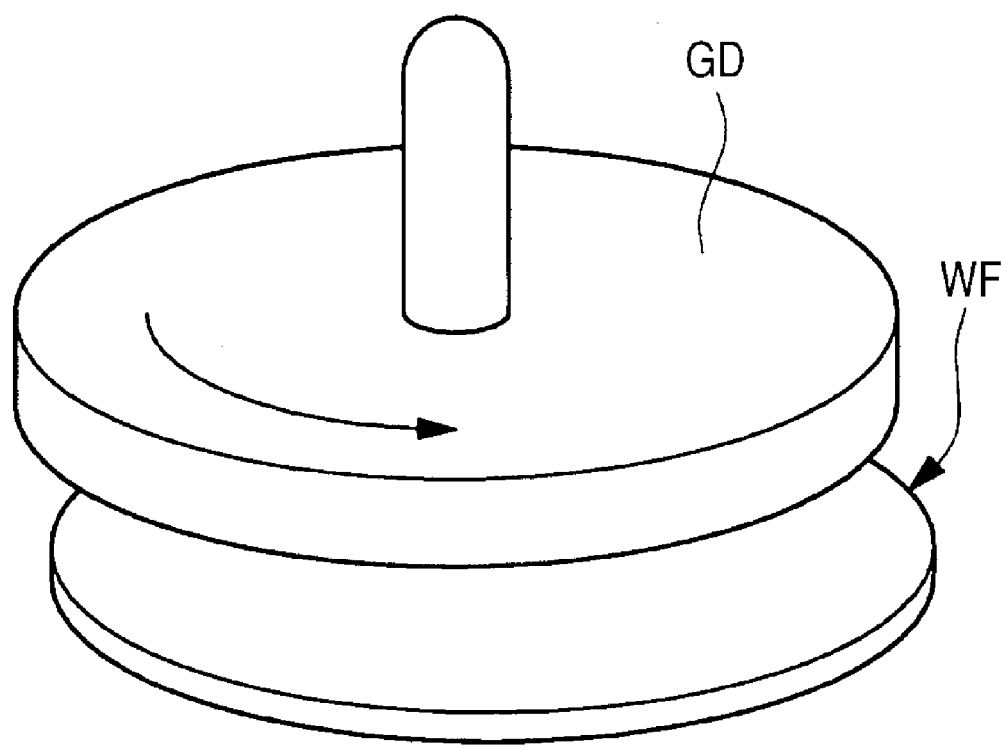
FIG. 17 is a perspective view showing a manufacturing step of the semiconductor device, following FIG. 16.
Figure 18:
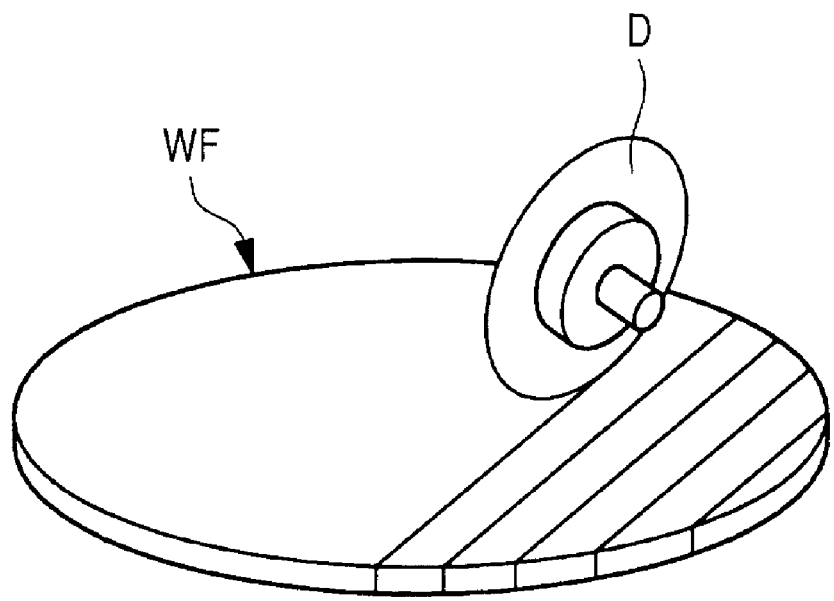
FIG. 18 is a perspective view showing a manufacturing step of the semiconductor device, following FIG. 17.
Figure 19:
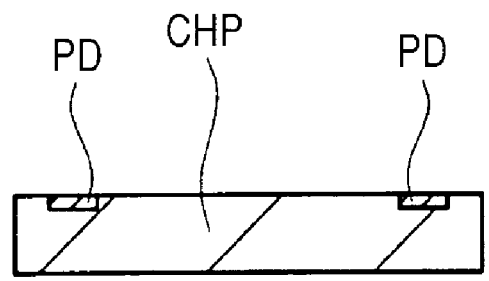
FIG. 19 is a section view showing a manufacturing step of the semiconductor device, following FIG. 18.

Following the above, in the present first embodiment, the backside of a semiconductor wafer WF is ground. Specifically, as shown in FIG. 17, the backside of the semiconductor wafer WF is ground using a grinder GD. After that, as shown in FIG. 18, the semiconductor wafer WF is diced using a dicer D. Due to this, a plurality of the semiconductor chips CHP as shown in FIG. 19 can be obtained. In FIG. 19, one semiconductor chip CHP is shown and on the main surface side (element formation surface side) of the semiconductor chip CHP, the pad PD is formed.

Figure 20:
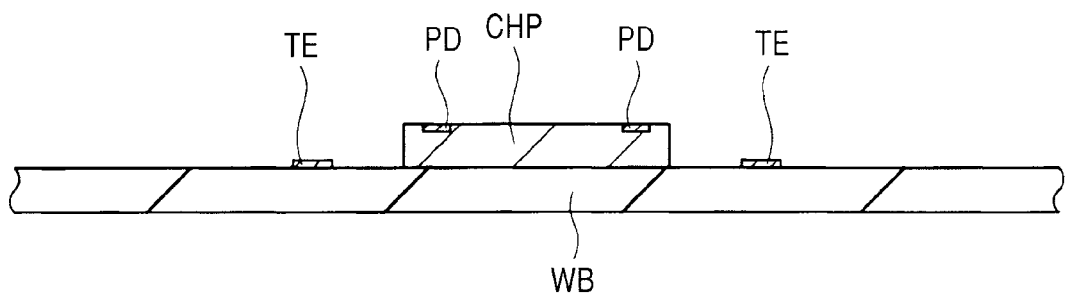
FIG. 20 is a section view showing a manufacturing step of the semiconductor device, following FIG. 19.

Next, as shown in FIG. 20, over the wiring board WB, the semiconductor chip CHP is mounted. At this time, on the chip mount surface side of the wiring board WB, the terminal TE is formed. As the material of the wiring board WB, the halogen-free member is used. The halogen-free member is used as the wiring board WB because the standpoint of environmental protection is taken into consideration. Here, the halogen-free member used as the material of the wiring board WB is defined as a material having a chlorine content of 0.09 weight percent or less and a bromine content of 0.09 weight percent or less and the total content of chlorine and bromine is 0.15 weight percent or less.

Figure 21:
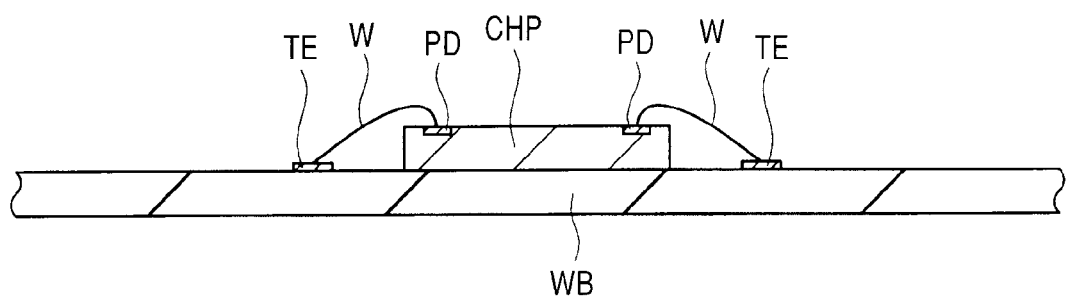
FIG. 21 is a section view showing a manufacturing step of the semiconductor device, following FIG. 20.
Figure 22:
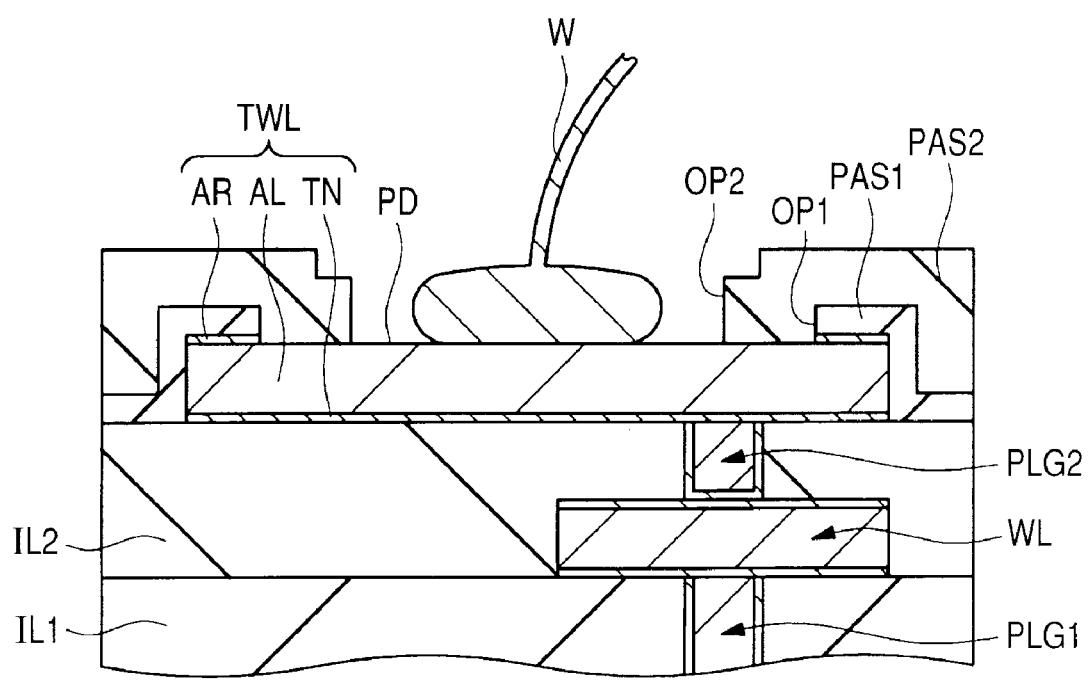
FIG. 22 is a section view showing a part in the vicinity of the pad formation region in FIG. 21.

Then, as shown in FIG. 21, the pad PD formed in the semiconductor chip CHP and the terminal TE formed over the wiring board WB are connected with the wire W including a gold wire. Specifically, as shown in FIG. 22, the wire W is connected to the pad PD that is exposed at the bottom of the opening OP2 formed in the surface protective film PAS2. At this time, on the surface of the pad PD, the antireflection film AR is removed and the aluminum film AL is exposed, and therefore, the aluminum film AL comes into direct contact with the wire W and it is possible to reduce the contact resistance between the pad PD and the wire W.

Figure 23:
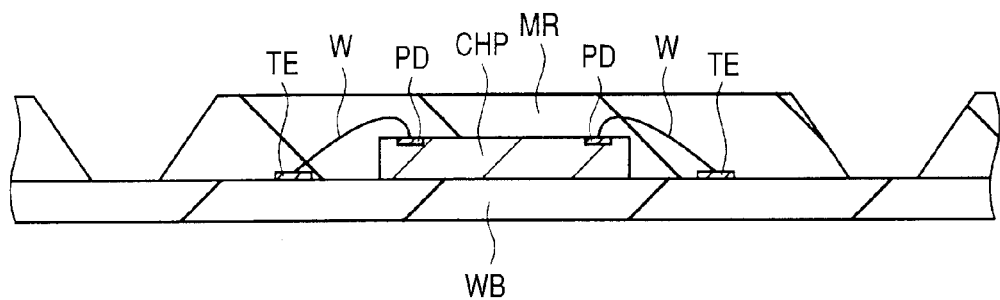
FIG. 23 is a section view showing a manufacturing step of the semiconductor device, following FIG. 22.

After that, as shown in FIG. 23, the semiconductor chip CHP and the wire W are sealed with the resin MR so as to be covered therewith. The resin MR is provided in order to protect the semiconductor chip CHP from an impact from outside and permeation of impurities. As the material constituting the resin MR, the halogen-free member is used from the importance of the recent environmental protection. The halogen-free member used as the material of the resin MR is defined as a material having a chlorine content of 0.09 weight percent or less, a bromine content of 0.09 weight percent or less, and an antimony content of 0.09 weight percent or less.

Figure 24:
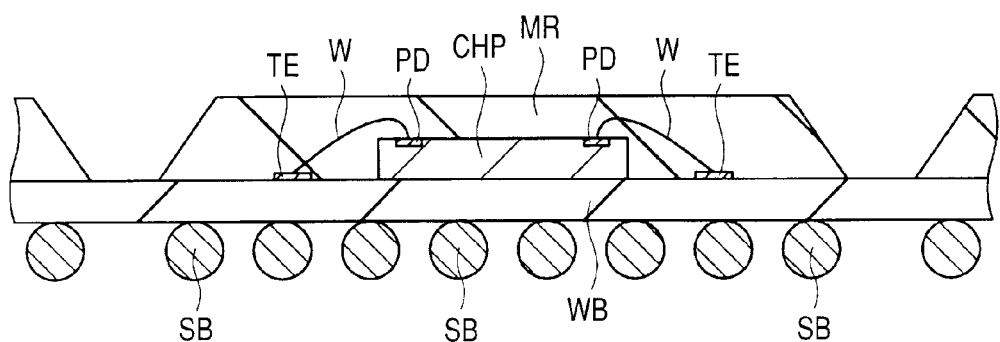
FIG. 24 is a section view showing a manufacturing step of the semiconductor device, following FIG. 23.
Figure 25:
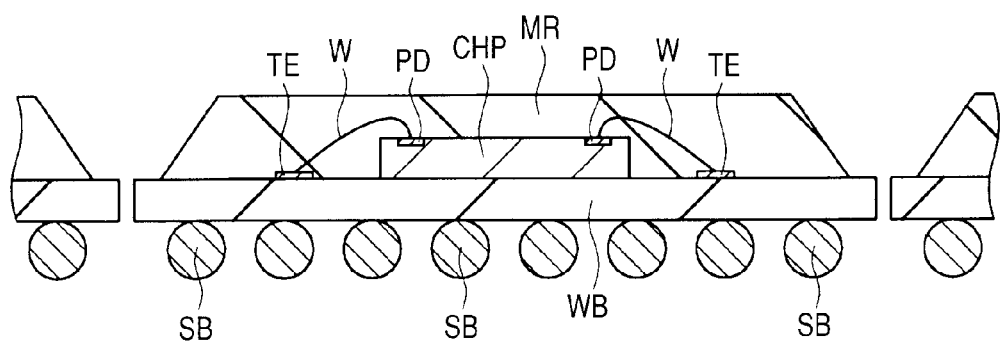
FIG. 25 is a section view showing a manufacturing step of the semiconductor device, following FIG. 24.

Following the above, as shown in FIG. 24, on the backside (surface on the opposite side of the chip mount surface) of the wiring board WB, the solder ball SB that serves as an external connection terminal is formed. Then, as shown in FIG. 25, the semiconductor device in the present first embodiment as shown in FIG. 7 can be manufactured by dicing the wiring board WB into individual pieces.

The package (semiconductor device) thus completed is required to operate normally in a wide range of temperatures because it is used under various temperature conditions. Because of this, after the product is completed, a voltage application test, in which a voltage is applied to the semiconductor device in a high-temperature (85° C. to 130° C.) and high-humidity (85%) environment, is conducted in order to ensure the reliability of the semiconductor device.

At this time, as shown in FIG. 8, in the present first embodiment 1, the configuration is such that the opening OP2 formed in the surface protective film PAS2 is smaller than the opening OP1 formed in the surface protective film PAS1 and the opening OP2 is included in the opening OP2. Due to this, it is possible to cover the side surface of the opening OP1 with the surface protective film PAS2. That is, it is possible to cover the side surface of the antireflection film AR that is exposed at the side surface of the opening OP1 with the surface protective film PAS2. Due to this, in the voltage application test, it is possible to prevent water that permeates the corner part of the opening OP2 from coming into direct contact with the antireflection film AR that is exposed as the side surface of the opening OP1, and therefore, the volume expansion caused by the chemical reaction of the antireflection film AR can be suppressed. As a result of this, the occurrence of a large crack extending from the surface protective film PAS1 to the surface protective film PAS2 and the peeling of the antireflection film AR from the surface protective film PAS1 resulting from the volume expansion of the antireflection film AR can be suppressed. In particular, the occurrence of such a crack and the occurrence of peeling will surface as a defect of a semiconductor chip in a semiconductor device using the halogen-free member as the resin MR, however, according to the present first embodiment 1, more remarkable effects can be obtained to effectively prevent the occurrence of a crack and the occurrence of peeling also in a product that uses the halogen-free member as the resin MR by physically separating water that gathers in the pad PD from the antireflection film AR.

Second Embodiment

In the first embodiment described above, the opening OP1 is formed in the surface protective film PAS1 and after the antireflection film AR that is exposed at the bottom of the opening OP1 is removed, the opening OP2 is formed in the surface protective film PAS2. Then, by forming the opening OP2 in the surface protective film PAS2, the pad PD in which the aluminum film AL is exposed at the bottom of the opening OP2 is formed. At this time, the surface of the aluminum film AL that is exposed in the pad PD formation region is cleaned by removing the antireflection film AR that is exposed from the opening OP1 and further performing anti-corrosion processing.

However, in the present second embodiment, after that, over the aluminum film AL having the cleaned surface, the surface protective film PAS2 is formed and the opening OP2 is formed in the surface protective film PAS2. At this time, the aluminum film AL is exposed from the opening OP2, however, on the surface of the aluminum film AL, the surface protective film PAS2 is formed after the surface is cleaned, and then, the aluminum film AL is exposed by the opening OP2 as a result. In the first embodiment described above, the surface of the aluminum film AL that is exposed after the opening OP2 is formed is not subjected to cleaning processing. That is, on the surface of the aluminum film AL that is once cleaned, the surface protective film PAS2 is formed and the opening OP2 is formed in the surface protective film PAS2, and then, the surface of the aluminum film AL is exposed again. In this case, on the surface of the aluminum film AL that is cleaned, the surface protective film PAS2 is formed, and therefore, there is a possibility that an affected layer is formed on the surface of the aluminum film AL. If such an affected layer is formed on the surface of the aluminum film AL, there is a possibility that the contact strength and the contact resistance between the aluminum film AL constituting the pad PD and the gold wire constituting the wire are deteriorated.

Because of this, in the present second embodiment, over the aluminum film AL that is cleaned, the surface protective film PAS2 is formed and after the opening OP2 is formed in the surface protective film PAS2, the surface of the aluminum film AL is etched and subjected to cleaning processing again. Specifically, the surface of the aluminum film AL that is exposed is etched before the anti-corrosion processing explained in FIG. 16 is performed.

Figure 26:
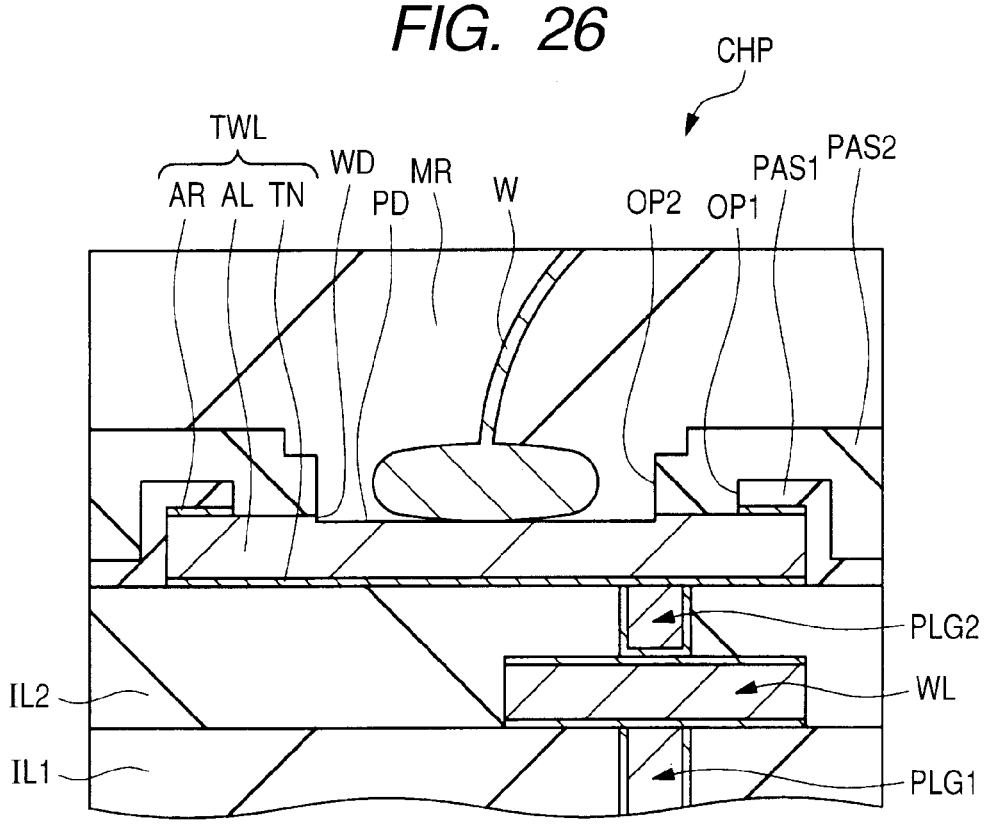
FIG. 26 is a section view showing a semiconductor device in a second embodiment.

FIG. 26 is a section view showing a structure in the vicinity of the pad PD of the semiconductor chip CHP in the present second embodiment. The structure of the semiconductor chip CHP shown in FIG. 26 is substantially the same as the structure of the semiconductor chip CHP in the first embodiment described above shown in FIG. 8. The point of difference between the semiconductor chip CHP shown in FIG. 26 and the semiconductor chip CHP shown in FIG. 8 is that the surface of the pad PD that is exposed from the opening OP2 is etched and a groove WD is formed in FIG. 26, however, in FIG. 8, no groove is formed in the surface of the pad PD. That is, in the present second embodiment, as shown in FIG. 26, the groove WD is formed in the surface of the pad PD. This is a result of that the surface of the aluminum film AL that is exposed at the bottom of the opening OP2 is etched after the opening OP2 is formed in the surface protective film PAS2. That is, in the present second embodiment, the surface protective film PAS2 is formed on the surface of the aluminum film AL, and therefore, there is a possibility that an affected layer is formed on the surface of the aluminum film AL. Because of this, after the opening OP2 is formed in the surface protective film PAS2, there is a possibility that an affected layer is formed on the surface of the aluminum film AL that is exposed from the opening OP2. Because of this, the aluminum film AL that is exposed from the opening OP2 is subjected to etching processing and thus the affected layer formed on the surface of the aluminum film AL is removed. As a result of the etching processing, the groove WD is formed in the surface of the aluminum film AL that is exposed from the opening OP2. As described above, in the present second embodiment, the surface of the aluminum film AL that is exposed from the opening OP2 can be cleaned, and therefore, it is possible to increase the contact strength and realize reduction in contact resistance between the aluminum film AL constituting the pad PD and the gold wire constituting the wire W.

Figure 27:
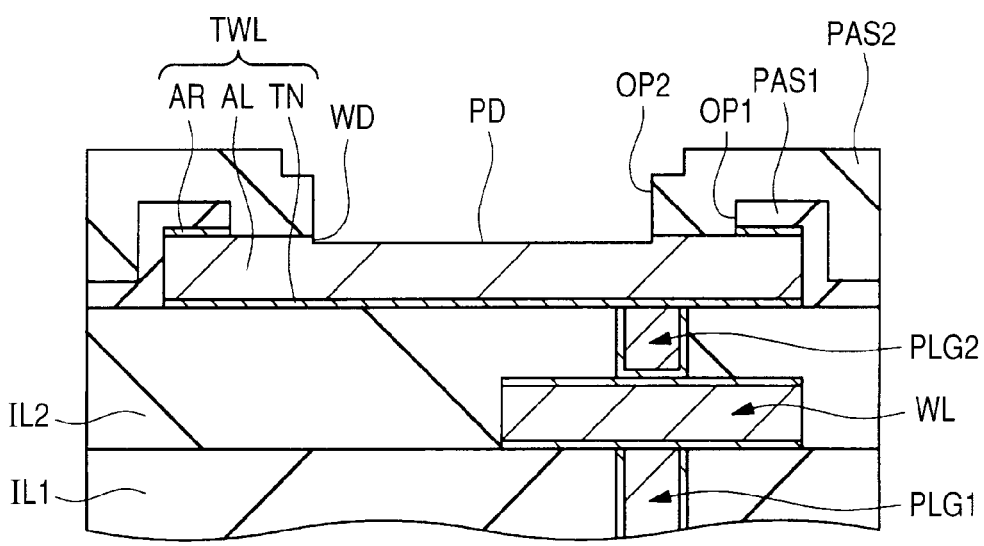
FIG. 27 is a section view showing a manufacturing step of the semiconductor device in the second embodiment.

The semiconductor device in the present second embodiment is configured as described above, and a method of manufacturing the same is explained below. The manufacturing step of the semiconductor device in the present second embodiment is substantially the same as the manufacturing step of the semiconductor device in the first embodiment described above. That is, the steps in FIG. 9 to FIG. 16 are the same as those in the first embodiment described above. Following the above-mentioned steps, in the present second embodiment, as shown in FIG. 27, the surface of the aluminum film AL that is exposed from the opening OP2 formed in the surface protective film PAS2 is subjected to etching processing. Specifically, the surface of the aluminum film AL is etched using an etching gas including $Cl_2$ and Ar, and then, anti-corrosion processing is performed using a gas including $H_2O$ and $O_2$. Due to this, the surface of the aluminum film AL that is exposed from the opening OP2 is etched and the affected layer formed on the surface of the aluminum film AL can be removed. As a result of that, the groove WD is formed in the surface of the aluminum film AL that is exposed from the opening OP2. The subsequent steps are the same as those in the first embodiment described above. In the manner described above, it is possible to manufacture the semiconductor device in the present second embodiment.

It is more desirable to perform the anti-corrosion processing explained in FIG. 16 in the first embodiment described above after forming the groove WD in the surface of the aluminum film AL.

Third Embodiment

In the first embodiment described above, as shown in FIG. 8, the opening OP2 is formed so that the opening OP2 is included in the opening OP1 and the side surface of the opening OP1 at which the antireflection film AR is exposed is covered with the surface protective film PAS2. Due to such a configuration, in the first embodiment described above, in the voltage application test, the remarkable effect can be obtained that water that permeates the corner part of the opening OP2 can be prevented from coming into direct contact with the antireflection film AR that is exposed at the side surface of the opening OP1 and the occurrence of a large crack extending from the surface protective film PAS1 to the surface protective film PAS2 and the peeling of the antireflection film AR from the surface protective film PAS1 can be suppressed.

In a third embodiment, another effect is explained, which can be exhibited by further devising and improving the configuration in which the opening OP2 is formed so that the opening OP2 is included in the opening OP1 and the side surface of the opening OP1 at which the antireflection film AR is exposed is covered with the surface protective film PAS2.

First, before the characteristics of the semiconductor device in the present third embodiment are explained, the background technique that has brought the technical concept is explained. In the recent semiconductor chip, accompanying the improvement in the degree of integration and the improvement in the semiconductor characteristics, the number of pads per unit area is increased and further, the area of each individual pad is reduced. Because of this, in the semiconductor chip formed by applying the most recent process, the possibility becomes higher compared to the conventional product that the wire is not connected to the center part of the pad but shifted therefrom in the wire bonding step. If the wire is connected shifted from the center part of the pad, the possibility becomes high that the wire is stranded not only on the pad but also on the surface protective film formed around the pad. If the wire is formed stranded on the surface protective film, there arises a problem that a crack occurs in the surface protective film due to the impact of wire bonding and the surface protective film is destroyed.

Figure 28:
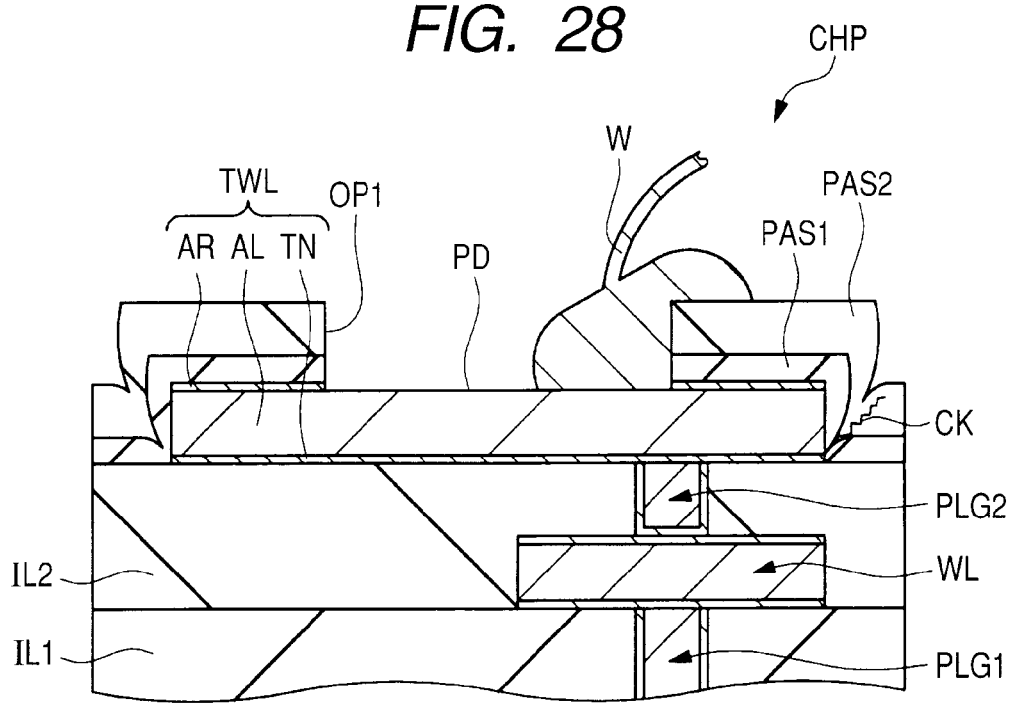
FIG. 28 is a diagram for explaining a problem of the prior art.

This problem is explained specifically with reference to the drawings. FIG. 28 is a section view showing a state where a wire is stranded on a surface protective film in a conventional structure. In FIG. 28, part of the top of the uppermost layer wire TWL is opened and thus the pad PD is formed. That is, over the uppermost layer wire TWL, the surface protective film PAS1 and the surface protective film PAS2 are formed and in the surface protective film PAS1 and the surface protective film PAS2, the opening OP1 is formed. Then, the uppermost layer wire TWL that is exposed at the bottom of the opening OP1 forms the pad PD. At this time, the film thickness of the surface protective film PAS1 is less than the thickness of the pad PD and the coverage of the step difference between the uppermost layer wire TWL and the interlayer insulating film IL2 is also deteriorated. Consequently, the coverage of the surface protective film PAS2 formed over the surface protective film PAS1 is also deteriorated because of the coverage of the surface protective film PAS1, which is the backing thereof.

The case is considered, where the wire bonding step is performed in this state and part of the wire is shifted from the center part of the pad PD and stranded on the surface protective film PAS2. In recent years, the trend is toward finer semiconductor devices and also toward smaller area of the pad PD. Because of this, when the wire is connected to the pad PD, it becomes more likely that the wire is stranded on the surface protective film PAS2. Further, after the wire is connected to the pad PD, adhesion by ultrasonic vibrations is performed, and therefore, the wire is not always formed in the center of the pad PD and the wire is likely to be shifted during adhesion. In this case, the wire is stranded on the surface protective film PAS2, an impact is imparted to the surface protective film PAS1 and the surface protective film PAS2 at the time of bonding. Specifically, pressures in the vertical direction are applied to the surface protective film PAS1 and the surface protective film PAS2, and at the same time, pressures in the horizontal direction are also applied thereto. At this time, a stress that causes a horizontal shift is applied to the step difference part between the uppermost layer wire TWL and the interlayer insulating film IL2 due to the pressures in the horizontal direction as a result. In this case, the total film thickness of the surface protective film PAS1 and the surface protective film PAS2 is less than the thickness of the pad PD and the coverage of the step difference part is deteriorated, and therefore, the resistance to the stress in the horizontal direction that is applied to the step difference part is low, and the stress is applied to the step difference part with low resistance in a concentrated manner. As a result of this, the crack CK occurs in the surface protective film PAS1 and the surface protective film PAS2 that cover the step difference part. If the crack CK occurs in the surface protective film PAS1 and the surface protective film PAS2, the surface protective film PAS1 and the surface protective film PAS2 are destroyed and the semiconductor chip CHP becomes defective.

Because of this, in the present third embodiment, the configuration of the surface protective film PAS1 and the surface protective film PAS2 is devised, and thereby, a semiconductor device is provided, in which a cracker is unlikely to occur even when part of the wire is stranded on the surface protective film PAS2. The characteristic configuration of the semiconductor device in the present third embodiment is explained below.

Figure 29:
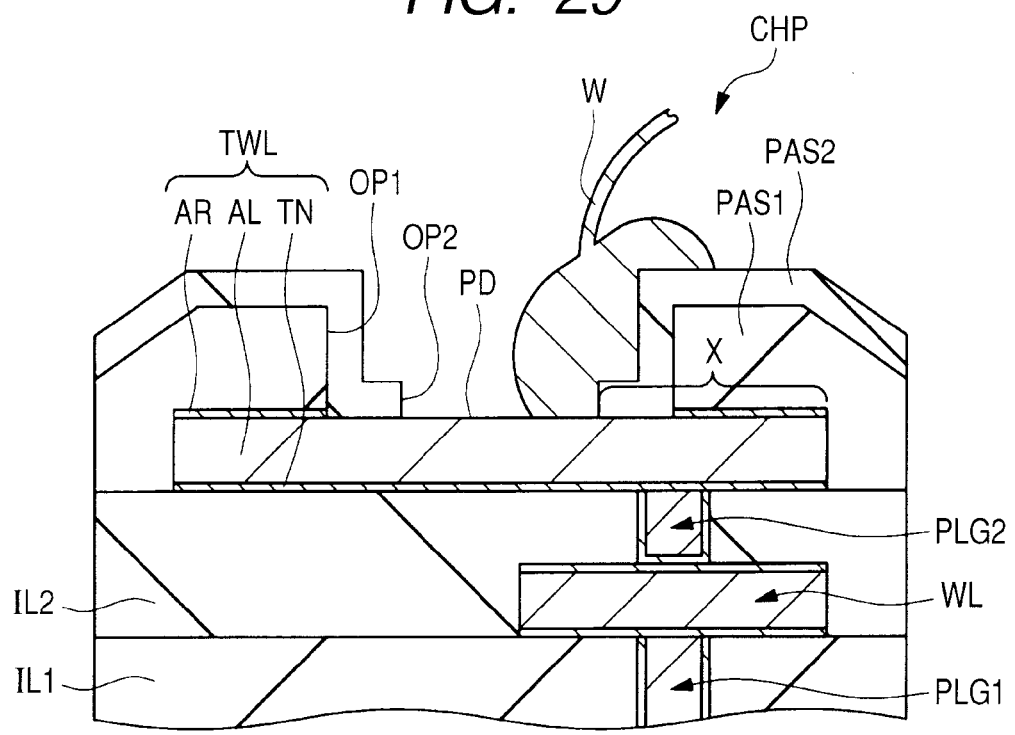
FIG. 29 is a diagram for explaining an advantage of a semiconductor device in a third embodiment.

FIG. 29 is a section view showing a structure in the vicinity of the pad PD of the semiconductor chip CHP in the present third embodiment. In FIG. 29, the first characteristic point of the present third embodiment is that the film thickness of a surface protective film HDP is increased. Specifically, the film thickness of the surface protective film HDP is equal to or greater than the film thickness of the pad PD (the uppermost layer wire TWL), for example, about 700 to 1,000 nm. Due to this, the total film thickness of the surface protective film HDP and the surface protective film PAS2 is greater than the thickness of the pad PD (the uppermost layer wire TWL). Further, the film thickness of the surface protective film HDP is greater than the film thickness of the surface protective film PAS2.

FIG. 29 shows an example in which the surface protective film PAS1 described in the first and second embodiments described above is not formed, however, it may also be possible to form the surface protective film PAS1 thin before the surface protective film HDP is formed. In that case, it is possible to obtain excellent coverage properties by making the film thickness of the surface protective film HDP greater than the film thickness of the surface protective film PAS1.

As a result of the above, as shown in FIG. 29, even if part of the wire is stranded on the surface protective film PAS2, it is possible to suppress a crack from occurring in the surface protective film HDP and the surface protective film PAS2 that cover the step difference part between the uppermost layer wire TWL and the interlayer insulating film IL2. This is because when the total film thickness of the surface protective film HDP and the surface protective film PAS2 is sufficiently great, it is possible to relax the stress that acts in the horizontal direction even if part of the wire is stranded on the surface protective film PAS2. This is because it can be thought that when the total film thickness of the surface protective film HDP and the surface protective film PAS2 increases, the direction of the force that is applied when part of the wire W is stranded on the surface protective film PAS2 becomes closer to the vertical direction, and therefore the component of the force that acts in the horizontal direction becomes smaller. As a result of that, the stress that causes a horizontal shift of the surface protective film HDP and the surface protective film PAS2 is relaxed, and therefore, a crack becomes more unlikely to occur in the surface protective film HDP and the surface protective film PAS2 that cover the step difference part between the uppermost layer wire TWL and the interlayer insulating film IL2. In particular, if the total film thickness of the surface protective film HDP and the surface protective film PAS2 is increased to 1,000 nm or more, it is possible to sufficiently suppress the occurrence of a crack.

Following the above, the second characteristic point of the capability of suppressing a crack from occurring is that the surface protective film HDP uses a silicon oxide film formed by the high-density plasma CVD method. The high-density plasma CVD method referred to here is a method that uses plasma having a density higher than that used in the plasma CVD method of forming, for example, the surface protective film PAS2. Specifically, the high-density plasma CVD method is a method of depositing a film by a chemical reaction of a gas that has been turned into highly dense plasma by using a high-frequency electric field/magnetic field, and the high-density plasma generating method includes the induction coupled plasma (ICP) method and the electron cyclotron resonance (ECR) method.

The film formed by the high-density plasma CVD method has properties that the coverage is excellent. Because of this, by forming the surface protective film HDP by a silicon oxide film formed by the high-density plasma CVD method, it is possible to make excellent the coverage properties of the step difference part between the uppermost layer wire TWL and the interlayer insulating film IL2. For example, the coverage properties of the surface protective film HDP are more excellent than the coverage properties of the surface protective film PAS2 and most excellent of the coverage properties of the surface protective film HDP and the surface protective film PAS2. Because of this, it is possible to increase the resistance to the stress in the horizontal direction that is applied to the step difference part between the uppermost layer wire TWL and the interlayer insulating film IL2, and therefore, it is possible to suppress a crack from occurring in the step difference part between the uppermost layer wire TWL and the interlayer insulating film IL2 even when part of the wire W is stranded on the surface protective film PAS2.

Next the third characteristic point of the capability of suppressing a crack from occurring is that the opening OP2 is formed so that the size (diameter) of the opening OP2 formed in the surface protective film PAS2 is made less than the size (diameter) of the opening OP1 formed in the surface protective film HDP, and the opening OP2 is included in the opening OP1. Due to this, the side surface of the opening OP1 is covered with the surface protective film PAS2 and further, it is possible to make the boundary between the pad PD and the surface protective film HDP into the form of a step of the surface protective film PAS2. Because of this, when part of the wire W is stranded on the surface protective film PAS2, it is possible to disperse the stress that is applied to the surface protective film PAS2 and the surface protective film HDP. As a result of that, it is possible to suppress the occurrence of a crack caused by the concentration of the stress.

From the standpoint of the first embodiment described above, it can be said that the third characteristic point is the configuration in which water that permeates the corner part of the opening OP2 is prevented from coming into direct contact with the antireflection film AR that is exposed at the side surface of the opening OP1, and the configuration in which the occurrence of a large crack that extends from the surface protective film PAS1 to the surface protective film PAS2 and the peeling of the antireflection film AR from the surface protective film PAS1 can be suppressed in the voltage application test. Further, from the standpoint of the third embodiment described above, it can be said that the third characteristic point is the configuration in which the stress that is applied to the surface protective film PAS2 and the surface protective film HDP can be dispersed when part of the wire W is stranded on the surface protective film PAS2, and the configuration in which the occurrence of a crack due to the concentration of the stress can be suppressed. As described above, it can be said that the third characteristic point is the configuration that exhibits another effect from the different standpoint. Then, in the present third embodiment, the configuration is such that the occurrence of a crack can be suppressed sufficiently even if part of the wire W is stranded on the surface protective film PAS2 by further improving the configuration of the third characteristic point and adding the first characteristic point and the second characteristic point thereto.

The semiconductor device in the present third embodiment is configured as described above and a method of manufacturing the same is explained below. The steps in FIG. 9 to FIG. 11 are the same as those in the first embodiment described above.

Figure 30:
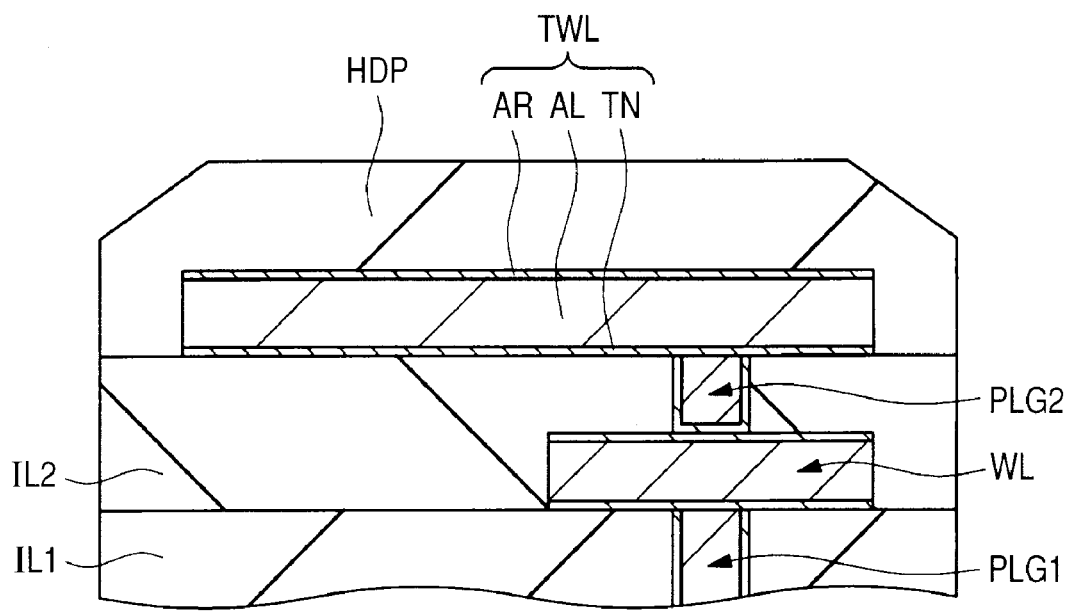
FIG. 30 is a section view showing a manufacturing step of the semiconductor device in the third embodiment.

Next, as shown in FIG. 30, over the interlayer insulating film IL2 over which the uppermost layer wire TWL is formed, the surface protective film HDP is formed. The surface protective film HDP is formed so as to cover the uppermost layer wire TWL. The surface protective film HDP is formed by, for example, a silicon oxide film, and can be formed by, for example, the high-density plasma CVD method. The surface protective film HDP is a film provided in order to protect the semiconductor element and the multilayer wire formed inside the semiconductor substrate from a mechanical stress and permeation of impurities. At this time, the film thickness of the surface protective film HDP is greater than the film thickness of the uppermost layer wire TWL and further, the surface protective film HDP is formed by the high-density plasma CVD method, and therefore, the coverage properties of the step difference part between the uppermost wire layer TWL and the interlayer insulating film IL2 are excellent. It may also be possible to form the surface protective film PAS1 thin before the surface protective film HDP is formed as in the first and second embodiments described above.

Figure 31:
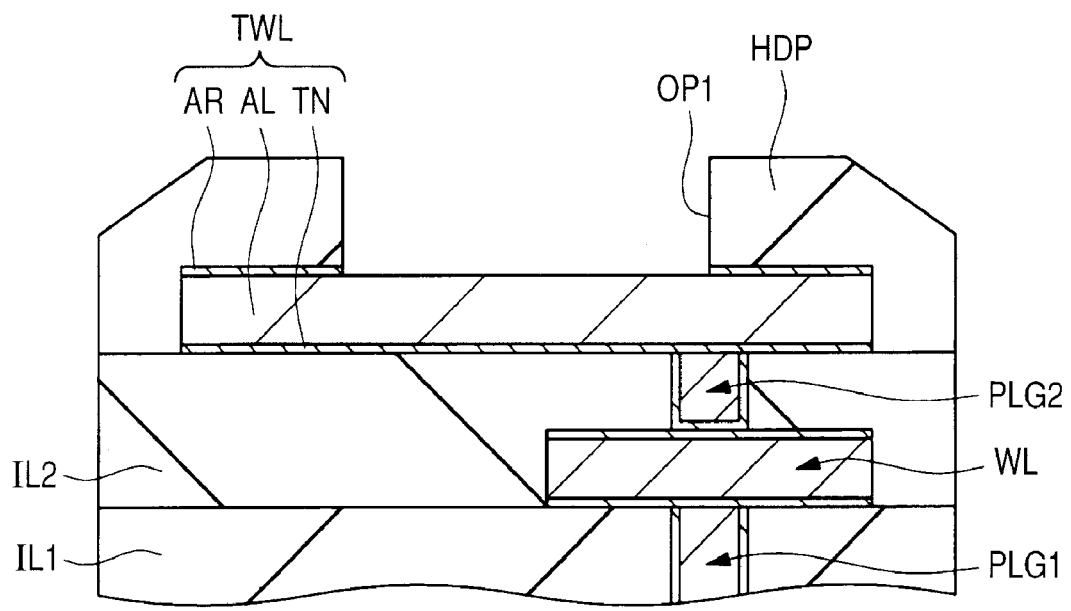
FIG. 31 is a section view showing a manufacturing step of the semiconductor device, following FIG. 30.

After that, as shown in FIG. 31, by using the photolithography technique and the etching technique, the surface protective film HDP is patterned. Specifically, the patterning of the surface protective film HDP is performed so that the opening OP1 at which part of the surface of the uppermost layer wire TWL is exposed is formed. At this time, the etching of the surface protective film HDP including a silicon oxide film is performed using an etching gas including $CHF_3$, $CF_4$, $O_2$ and Ar.

Following the above, the antireflection film AR that is exposed from the opening OP1 is removed by performing etching. The etching of the antireflection film AR including a titanium nitride film is performed using an etching gas including $Cl_2$ and Ar. The antireflection film AR that is exposed at the bottom of the opening OP1 is removed in order to reduce the contact resistance between a wire including a gold wire and the uppermost layer wire TWL when the wire is connected to the uppermost layer wire TWL in a subsequent step. That is, if the antireflection film AR is not removed, the silicon nitride film comes into contact with the wire, and therefore, the contact resistance is increased. Because of this, the antireflection film AR is removed and the aluminum film is caused to come into contact with the wire and thus the contact resistance is reduced. Further, in order to perform anti-corrosion processing on the surface of the aluminum film AL that is exposed after the titanium nitride film, which is the antireflection film AR, is removed, the anti-corrosion processing using a gas including $H_2O$ and $O_2$ is performed.

Figure 32:
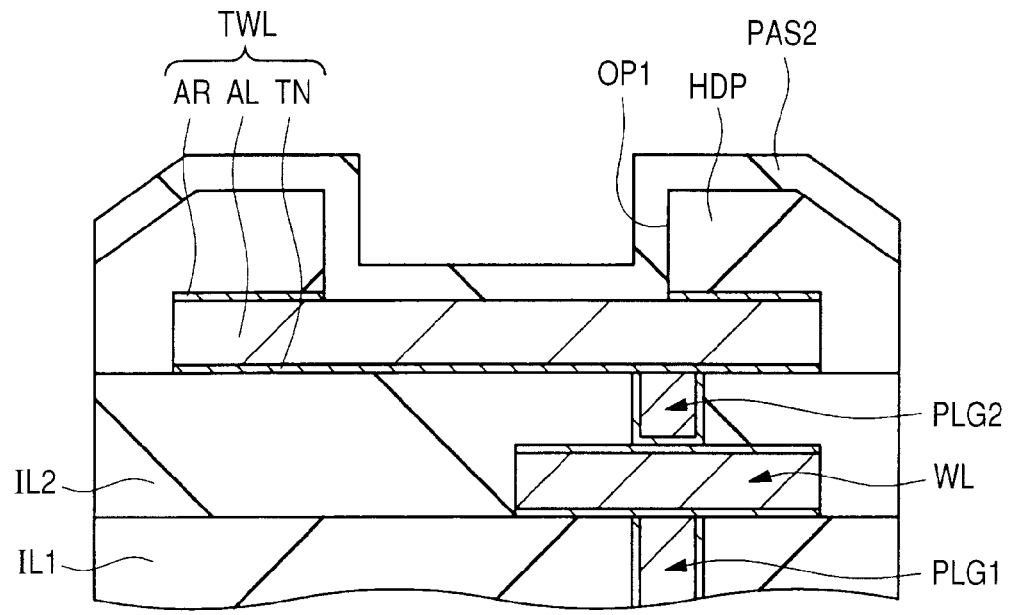
FIG. 32 is a section view showing a manufacturing step of the semiconductor device, following FIG. 31.

Next, as shown in FIG. 32, over the surface protective film HDP in which the opening OP1 is formed, the surface protective film PAS2 is formed. The surface protective film PAS2 is formed so that the opening OP1 is embedded therein. The surface protective film PAS2 is formed by, for example, a silicon nitride film, and can be formed by, for example, the plasma CVD method. Like the surface protective film HDP, the surface protective film PAS2 is a film also provided in order to protect the semiconductor element and the multilayer wire formed inside the semiconductor substrate from a mechanical stress and permeation of impurities. At this time, the total film thickness of the surface protective film HDP and the surface protective film PAS2 is greater than the thickness of the aluminum film AL, for example, 1,000 nm or more.

Figure 33:
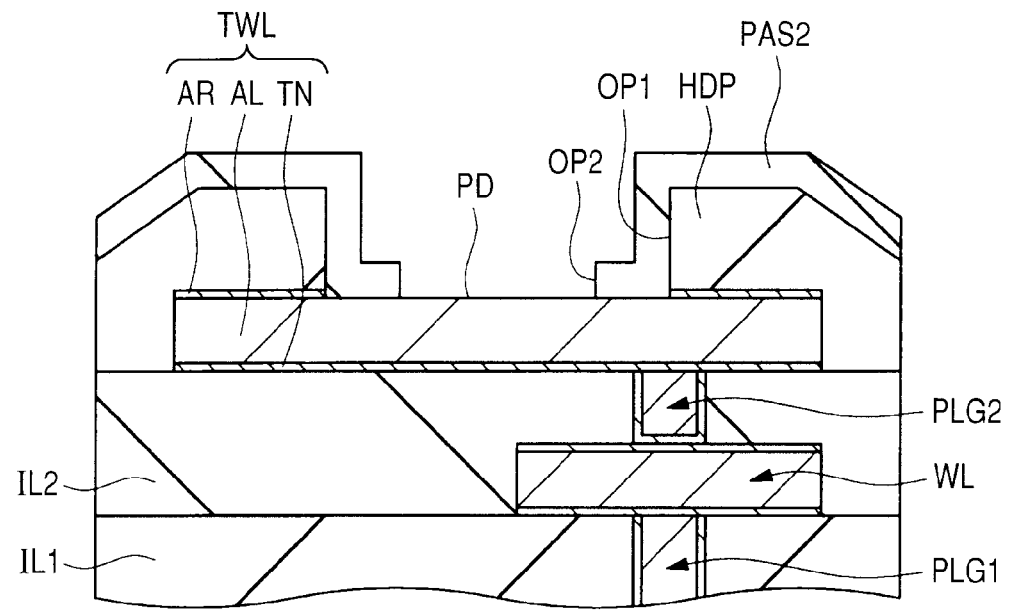
FIG. 33 is a section view showing a manufacturing step of the semiconductor device, following FIG. 32.

After that, as shown in FIG. 33, by using the photolithography technique and the etching technique, the opening OP2 is formed in the surface protective film PAS2. At this time, the opening OP2 is formed so that the size (diameter) of the opening OP2 formed in the surface protective film PAS2 is smaller than the size (diameter) of the opening OP1 formed in the surface protective film HDP and the opening OP2 is included in the opening OP1. As a result of that, the antireflection film AR that is exposed at the side surface of the opening OP1 is covered with the surface protective film PAS2. At the bottom of the opening OP2 formed in the surface protective film PAS2, the aluminum film AL constituting the uppermost layer wire TWL is exposed and the region where the aluminum film AL is exposed forms the pad PD. The etching of the surface protective film PAS2 in which the opening OP2 is formed is performed using an etching gas including $CHF_3$, $CF_4$, $O_2$ and Ar. In the manner described above, the pad PD can be formed in the uppermost layer of the multilayer wire. The subsequent steps are the same as those in the first embodiment described above. In the manner described above, it is possible to manufacture the semiconductor device in the present third embodiment.

It is also possible to combine the technique disclosed in the present third embodiment with the first embodiment and the second embodiment described above and more remarkable effects can be obtained.

Fourth Embodiment

Figure 34:
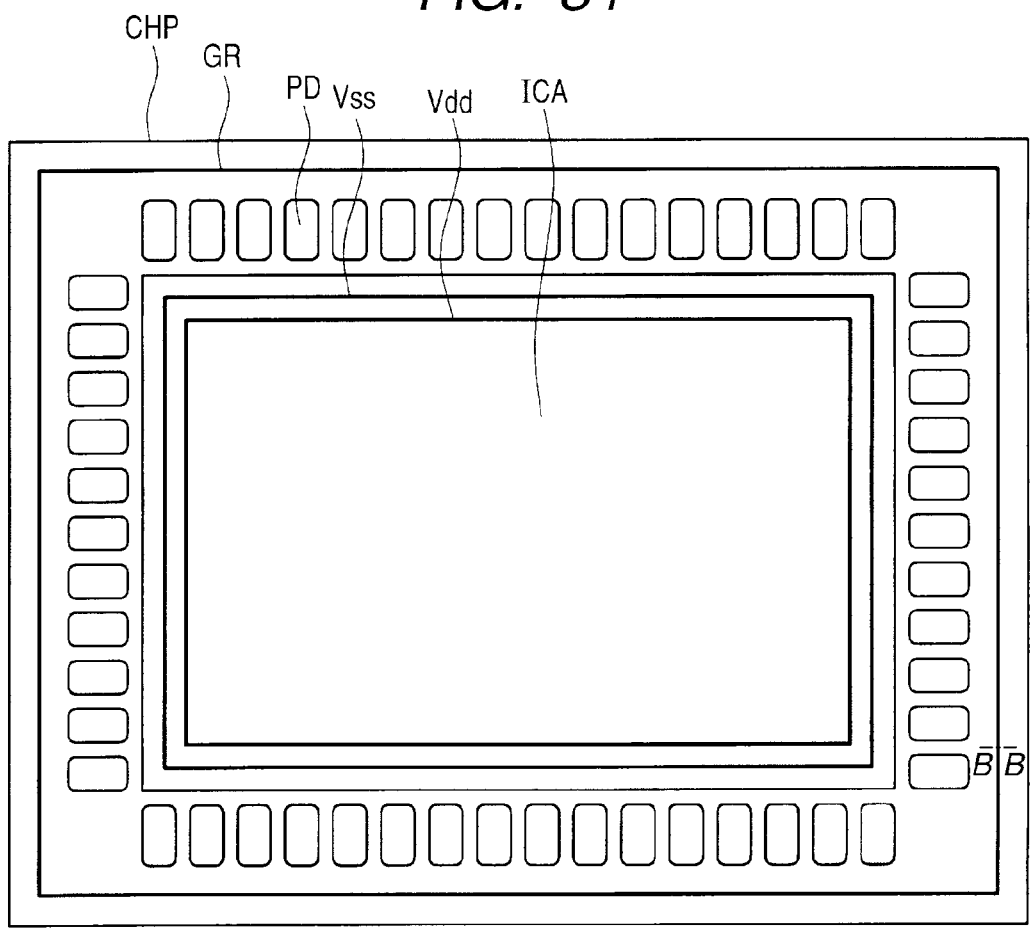
FIG. 34 is a diagram showing a layout configuration of a semiconductor chip in a fourth embodiment.

In the first to third embodiments described above, the configuration in the vicinity of the pad PD is explained, however, in a fourth embodiment, a configuration in the vicinity of a guard ring is explained. First, the configuration of the guard ring is explained. FIG. 34 is a diagram showing a planar layout configuration of the semiconductor chip CHP. FIG. 34 is substantially the same as the planar layout diagram shown in FIG. 5 in the first embodiment described above, however, a guard ring GR is formed along the peripheral region of the semiconductor chip CHP. Then, in an inner region surrounded by the guard ring GR, the pad PD is formed. The pad PD is formed along the four sides of the semiconductor chip CHP. That is, a plurality of the pads PD is formed along the four sides of the semiconductor chip CHP and the guard ring GR is formed so as to surround the exterior of the pad PD. The guard ring GR is provided in order to prevent impurities or water from permeating the inner region of the semiconductor chip CHP from outside and functions as a barrier wall. That is, in the inner region of the semiconductor chip CHP surrounded by the guard ring GR, the integrated circuit including the pad PD is formed, and the guard ring GR is formed in an outer region in which the integrated circuit is formed to prevent impurities (foreign materials) or water from permeating the region in which the integrated circuit is formed. By providing the guard ring GR in the semiconductor chip CHP as described above, it is possible to protect the integrated circuit formed in the semiconductor chip CHP and to improve the reliability of the integrated circuit.

Figure 35:
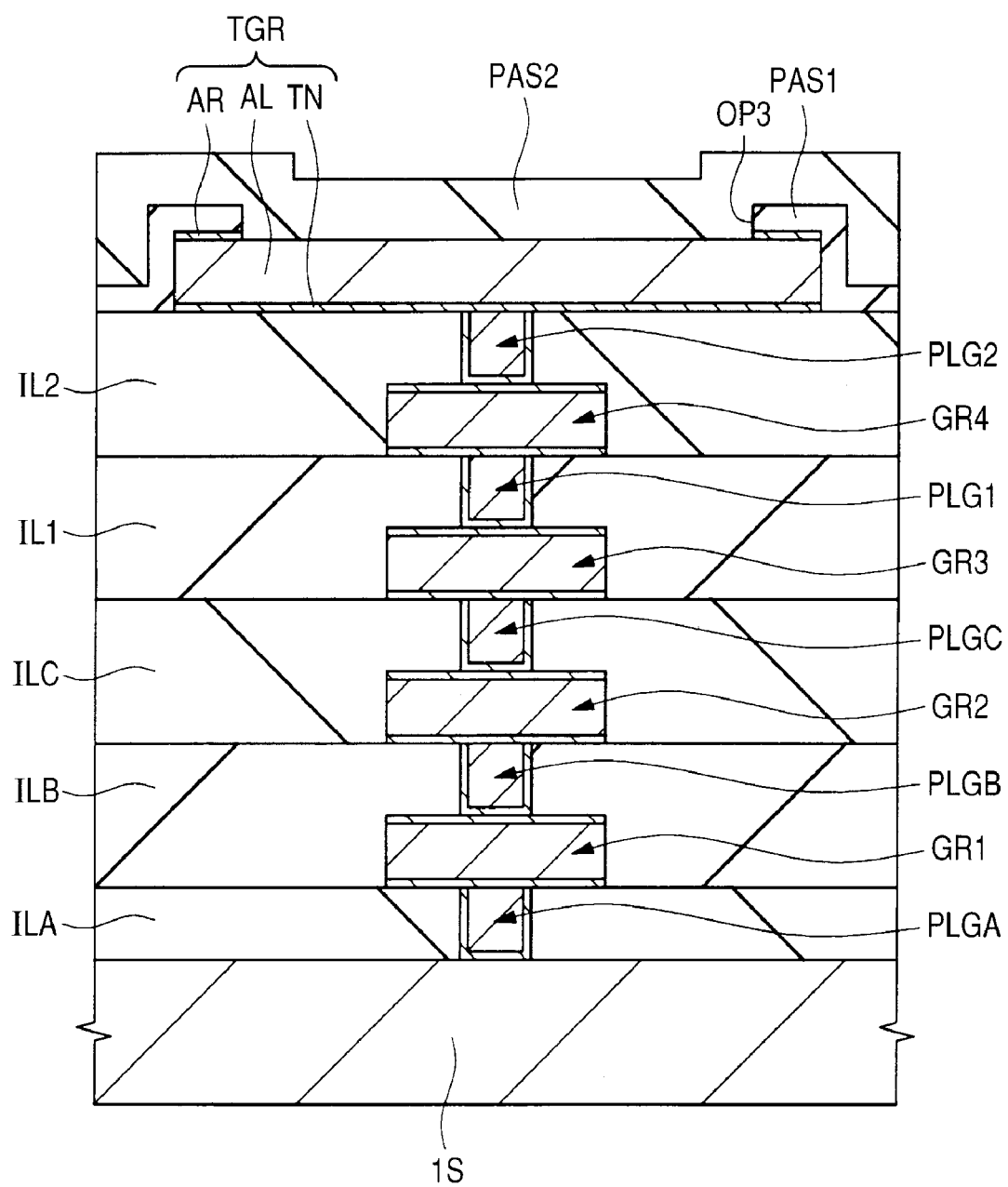
FIG. 35 is a section view cut along B-B line in FIG. 34.

Next, the structure of the guard ring GR is explained specifically. FIG. 35 is a section view cut along B-B line in FIG. 34. In FIG. 35, over a semiconductor substrate 1S, an interlayer insulating film ILA including, for example, a silicon oxide film, is formed and a plug PLGA is formed in the interlayer insulating film ILA. Then, over the interlayer insulating film ILA in which the plug PLGA is formed, a guard ring GR1 formed by the same material as that of the wire layer is formed. The guard ring GR1 is formed in the same step of the other wire layers and formed by, for example, a laminated film of a titanium/titanium nitride film, an aluminum film, and a titanium/titanium nitride film. Following the above, over the interlayer insulating film ILA in which the guard ring GR1 is formed, an interlayer insulating film ILB including, for example, a silicon oxide film, is formed, and a plug PLGB that penetrates through the interlayer insulating film ILB and reaches the guard ring GR1 is formed. Further, over the interlayer insulating film ILB in which the plug PLGB is formed, a guard ring GR2 is formed and over the interlayer insulating film ILB over which the guard ring GR2 is formed, an interlayer insulating film ILC including, for example, a silicon oxide film, is formed. Then, in the interlayer insulating film ILC, a plug PLGC is formed and the plug PLGC is electrically coupled with the guard ring GR2. Similarly, over the interlayer insulating film ILC in which the plug PLGC is formed, a guard ring GR3 is formed and the interlayer insulating film IL1 including, for example, a silicon oxide film, is formed so as to cover the guard ring GR3. In the interlayer insulating film IL1, the plug PLG1 is formed and the plug PLG1 is connected with the guard ring GR3. Over the interlayer insulating film IL1 in which the plug PLG1 is formed, a guard ring GR4 is formed and over the interlayer insulating film IL1 over which the guard ring GR4 is formed, the interlayer insulating film IL2 including, for example, a silicon oxide film, is formed. In the interlayer insulating film IL2, the plug PLG2 is formed and the plug PLG2 and the guard ring GR4 are connected. Then, over the interlayer insulating film IL2 in which the plug PLG2 is formed, a guard ring TGR is formed. The guard ring TGR is a film formed in the same layer as that of the uppermost wire layer, and similar to the uppermost layer wire, including a laminated film of the titanium nitride film TN, the aluminum film AL and the antireflection film AR. The antireflection film AR is formed by, for example, a titanium nitride film. As described above, the guard ring has a structure in which the plug PLG formed over the semiconductor substrate 1S through the guard ring TGR formed in the uppermost layer are connected. That is, the plug PLG1 formed over the semiconductor substrate 1S to the guard ring GR1, the plug PLGB, the guard ring GR2, the plug PLGC, the guard ring GR3, the plug PLG1, the guard ring GR4, the plug PLG2 and the guard ring TGR are connected and thus the barrier wall is formed. Due to this, it is possible to prevent impurities from permeating the inner region of the semiconductor chip.

Next, the configuration of the top part of the guard ring TGR is explained. Over the guard ring TGR, the surface protective film PAS1 including, for example, a silicon oxide film, is formed and an opening OP3 is formed in the surface protective film PAS1. The antireflection film AR that is exposed from the opening OP3 is removed. Then, over the surface protective film PAS1 in which the opening OP3 is formed, the surface protective film PAS2 including, for example, a silicon nitride film, is formed. The surface protective film PAS2 is formed so that the opening OP3 is embedded therein and the guard ring TGR is covered with the surface protective film PAS2.

The characteristics of the guard ring thus configured are that the opening OP3 is formed in the surface protective film PAS1 formed on the top part of the guard ring TGR, however, no opening is formed in the surface protective film PAS2 formed over the surface protective film PAS1 in which the opening OP3 is formed and that the guard ring TGR is covered with the surface protective film PAS2. Due to this, it is possible to sufficiently prevent impurities from permeating through the surface protective film PAS1 and the surface protective film PAS2 formed on the top part of the guard ring TGR.

For example, as a permeating path of impurities, the boundary surface between the surface protective film PAS1 and the surface protective film PAS2 can be conceived of, however, according to the present fourth embodiment, in the surface protective film PAS1, the opening OP3 is formed over the guard ring TGR, and therefore, the surface protective film PAS1 is divided. Then, over the surface protective film PAS1 in which the opening OP3 is formed, the surface protective film PAS2 is formed as a result, however, because of the existence of the opening OP3, the boundary surface between the surface protective film PAS1 and the surface protective film PAS2 is divided by the opening OP3. This means that the permeating path of impurities via the boundary surface between the surface protective film PAS1 and the surface protective film PAS2 is divided. Because of this, in the present fourth embodiment, it is possible to suppress impurities from permeating through the boundary surface between the surface protective film PAS1 and the surface protective film PAS2.

The guard ring in the present fourth embodiment is configured as described above and a method of manufacturing the same is explained below with reference to the drawings. Specifically, a method of manufacturing the semiconductor device in the present fourth embodiment is explained while comparing a pad formation region in which the pad PD is formed with a guard ring formation region in which the guard ring GR is formed.

Figure 36:
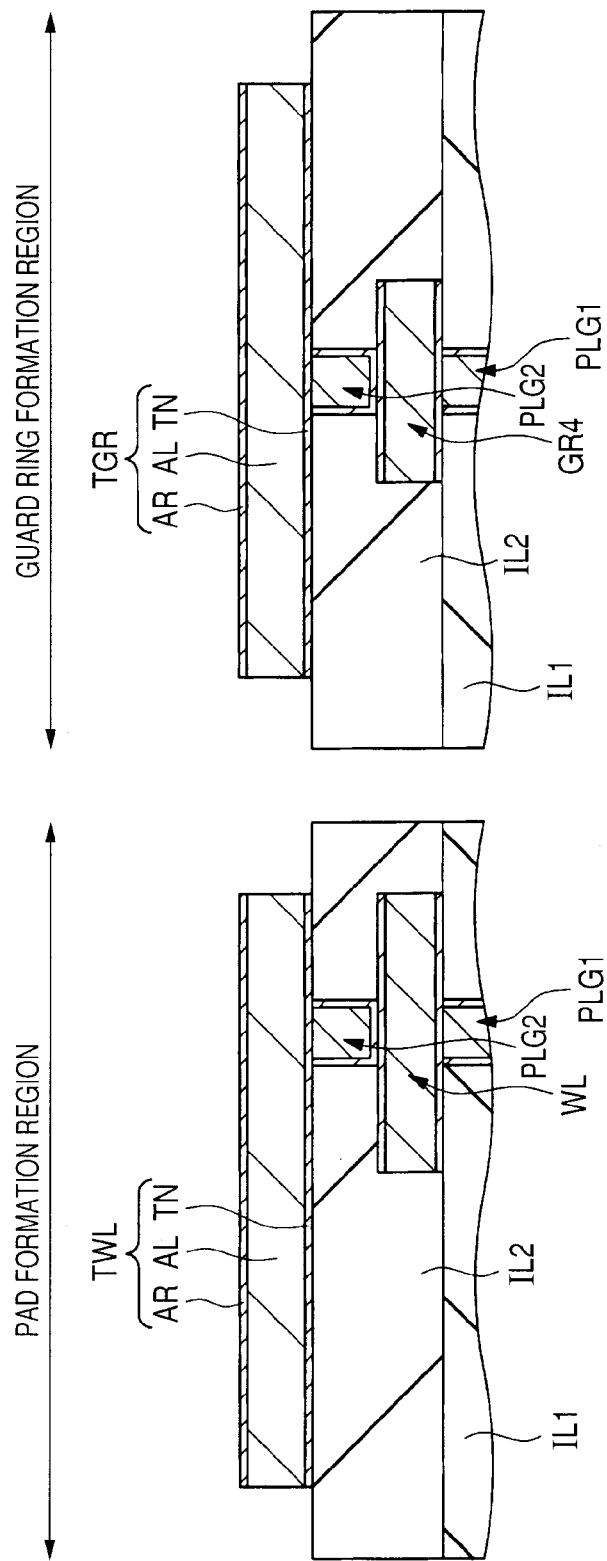
FIG. 36 is a section view showing a manufacturing step of a semiconductor device in the fourth embodiment.

First, through the steps shown in FIG. 9 to FIG. 11, a structure as shown in FIG. 36 is formed. Specifically, the uppermost layer wire TWL is formed in the pad formation region and the guard ring TGR is formed in the guard ring formation region. At this time, the uppermost layer wire TWL and the guard ring TGR are formed in the same step.

Figure 37:
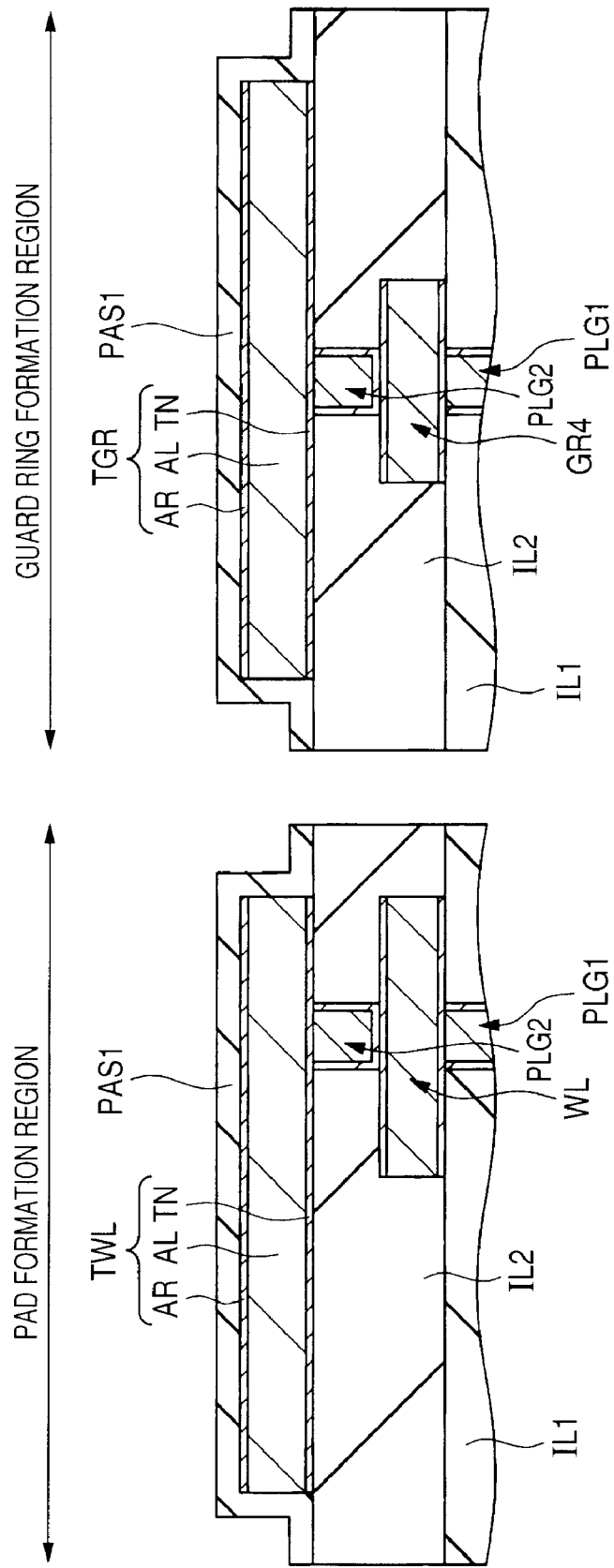
FIG. 37 is a section view showing a manufacturing step of the semiconductor device, following FIG. 36.

Next, as shown in FIG. 37, the surface protective film PAS1 is formed over the interlayer insulating film IL2 so as to cover the uppermost layer wire TWL and the guard ring TGR. That is, in the pad formation region, over the interlayer insulating film IL2 over which the uppermost layer wire TWL is formed, the surface protective film PAS1 is formed and in the guard ring formation region, over the interlayer insulating film IL2 over which the guard ring TGR is formed, the surface protective film PAS1 is formed. The surface protective film PAS1 is formed by, for example, a silicon oxide film, and can be formed by, for example, the plasma CVD method. The surface protective film PAS1 is a film provided in order to protect the semiconductor element and multilayer wire formed inside the semiconductor substrate from a mechanical stress and permeation of impurities.

Figure 38:
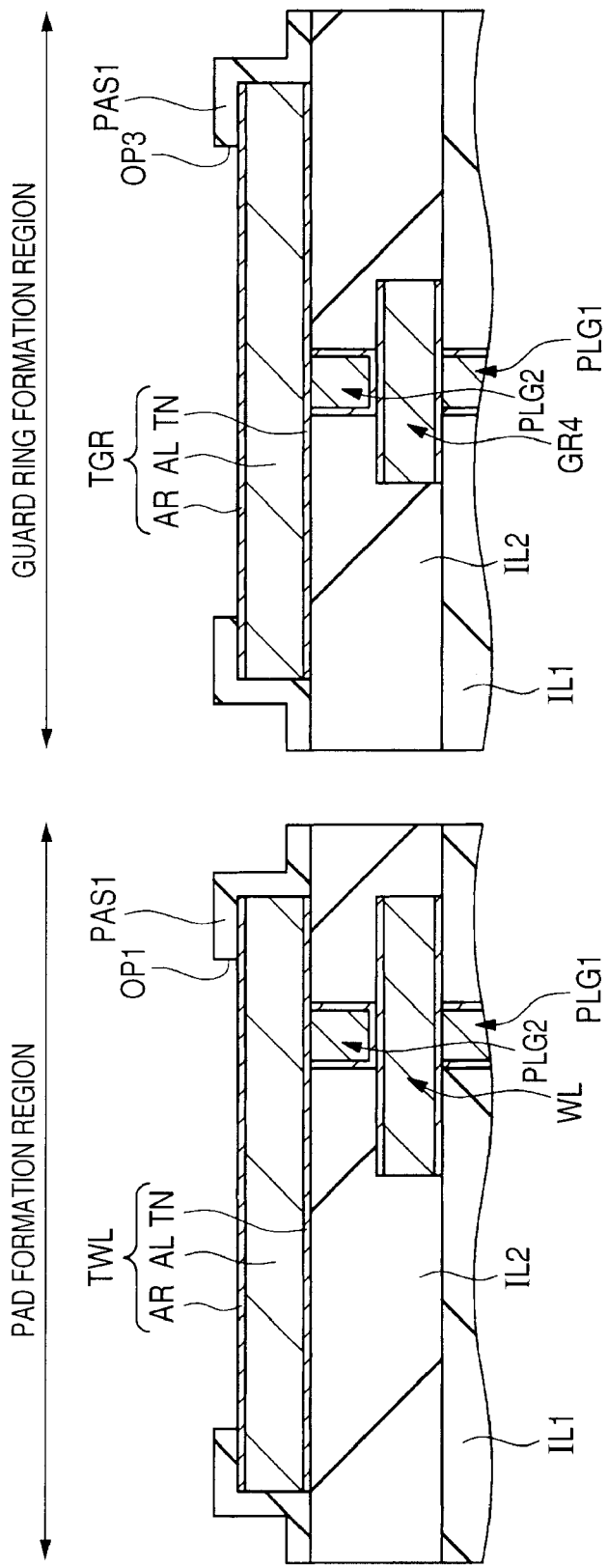
FIG. 38 is a section view showing a manufacturing step of the semiconductor device, following FIG. 37.

After that, as shown in FIG. 38, by using the photolithography technique and the etching technique, the surface protective film PAS1 is patterned. Specifically, the patterning of the surface protective film PAS1 is performed so that the opening OP1 at which part of the surface of the uppermost layer wire TWL is exposed is formed in the pad formation region, and so that the opening OP3 at which part of the surface of the guard ring TGR is formed in the guard ring formation region. At this time, the etching of the surface protective film PAS1 including a silicon oxide film is performed using an etching gas including $CHF_3$, $CF_4$, $O_2$ and Ar.

Figure 39:
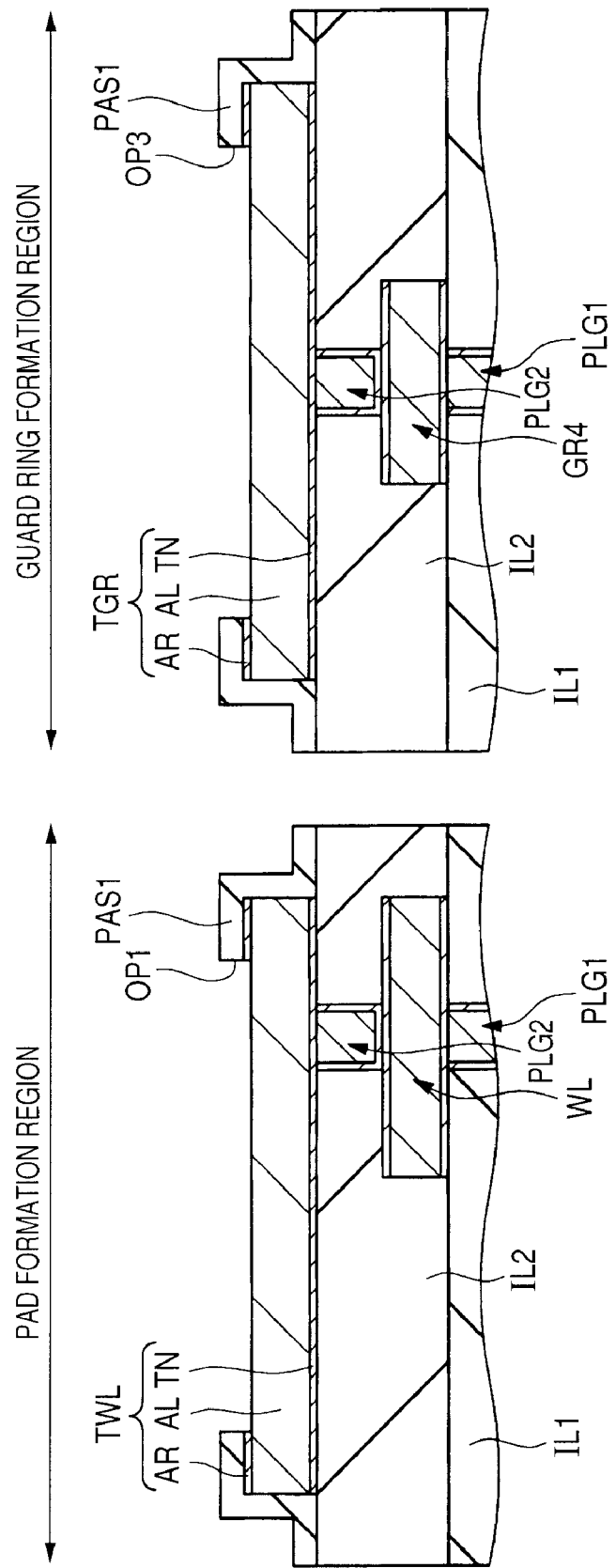
FIG. 39 is a section view showing a manufacturing step of the semiconductor device, following FIG. 38.

Following the above, as shown in FIG. 39, in the pad formation region, the antireflection film AR that is exposed from the opening OP1 is removed by performing etching. Similarly, in the guard ring formation region also, the antireflection film AR that is exposed from the opening OP3 is removed by performing etching. The etching of the antireflection film AR including a titanium nitride film is performed using an etching gas including $Cl_2$ and Ar. Further, in order to perform anti-corrosion processing on the surface of the aluminum film AL that is exposed after the titanium nitride film, which is the antireflection film AR, is removed, the anti-corrosion processing using a gas including $H_2O$ and $O_2$ is performed.

Figure 40:
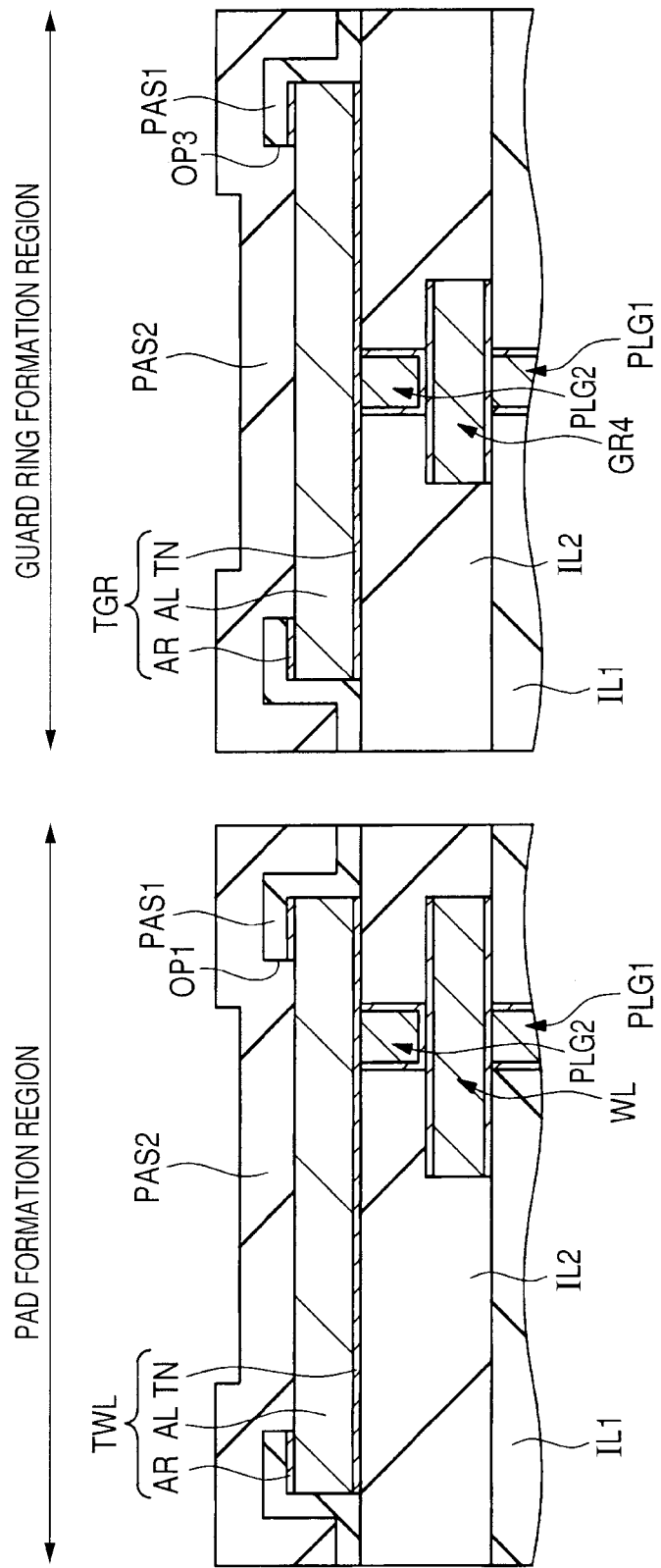
FIG. 40 is a section view showing a manufacturing step of the semiconductor device, following FIG. 39.

Next, as shown in FIG. 40, over the surface protective film PAS1 in which the opening OP1 is formed in the pad formation region and in which the opening OP3 is formed in the guard ring formation region, the surface protective film PAS2 is formed. The surface protective film PAS2 is formed so that the opening OP1 and the opening OP3 are embedded therein. The surface protective film PAS2 is formed by, for example, a silicon nitride film, and can be formed by, for example, the plasma CVD method. Like the surface protective film PAS1, the surface protective film PAS2 is a film also provided in order to protect the semiconductor element and the multilayer wire formed inside the semiconductor substrate from a mechanical stress and permeation of impurities.

Figure 41:
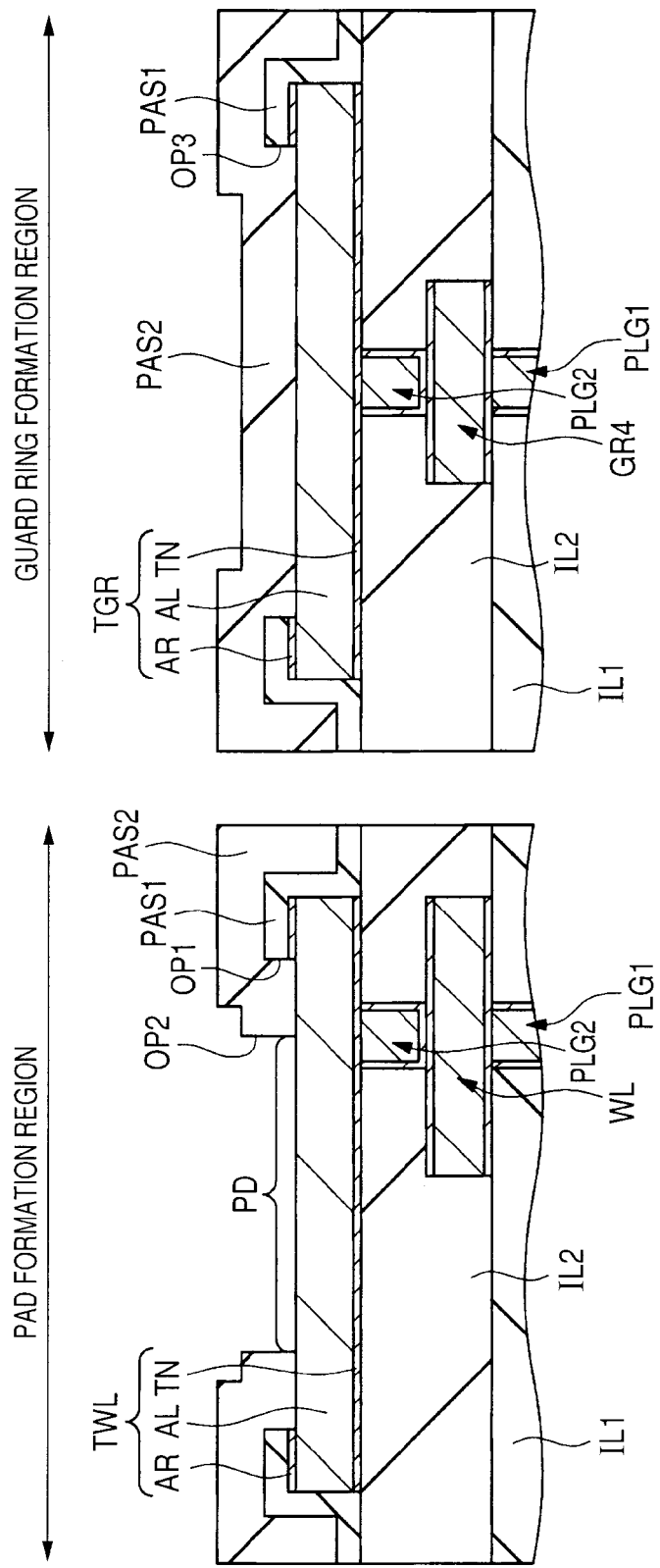
FIG. 41 is a section view showing a manufacturing step of the semiconductor device, following FIG. 40.

After that, as shown in FIG. 41, by using the photolithography technique and the etching technique, the opening OP2 is formed in the surface protective film PAS2 formed in the pad formation region. On the other hand, no opening is formed in the surface protective film PAS2 formed in the guard ring formation region. At this time, in the pad formation region, the opening OP2 is formed so that the size (diameter) of the opening OP2 formed in the surface protective film PAS2 is smaller than the size (diameter) of the opening OP1 formed in the surface protective film PAS1 and the opening OP2 is included in the opening OP1. As a result of that, the antireflection film AR that is exposed at the side surface of the opening OP1 is covered with the surface protective film PAS2. At the bottom of the opening OP2 formed in the surface protective film PAS2, the aluminum film AL constituting the uppermost layer wire TWL is exposed and the region where the aluminum film AL is exposed forms the pad PD. The etching of the surface protective film PAS2 in which the opening OP2 is formed is performed using an etching gas including $CHF_3$, $CF_4$, $O_2$ and Ar.

On the other hand, in the guard ring formation region, the surface protective film PAS2 in which the opening OP3 is embedded is kept to remain as is. Due to this, in the guard ring formation region, the opening OP3 is formed in the surface protective film PAS1 formed on the top part of the guard ring TGR, however, in the surface protective film PAS2 formed over the surface protective film PAS1 in which the opening OP3 is formed, no opening is formed and the guard ring TGR is covered with the surface protective film PAS2. Because of this, it is possible to sufficiently prevent impurities from permeating through the surface protective film PAS1 and the surface protective film PAS2 formed on the top part of the guard ring TGR. For example, as a permeating path of impurities, the boundary surface between the surface protective film PAS1 and the surface protective film PAS2 can be conceived of, however, according to the present fourth embodiment, in the surface protective film PAS1, the opening OP3 is formed over the guard ring TGR, and therefore, the surface protective film PAS1 is divided. Then, over the surface protective film PAS1 in which the opening OP3 is formed, the surface protective film PAS2 is formed as a result, however, because of the existence of the opening OP3, the boundary surface between the surface protective film PAS1 and the surface protective film PAS2 is divided by the opening OP3. This means that the permeating path of impurities via the boundary surface between the surface protective film PAS1 and the surface protective film PAS2 is divided. Because of this, in the present fourth embodiment, it is possible to suppress impurities from permeating through the boundary surface between the surface protective film PAS1 and the surface protective film PAS2. In the manner described above, it is possible to form the pad PD in the pad formation region and the guard ring structure in the guard ring formation region. The subsequent steps are the same as those in the first embodiment described above. In the manner described above, it is possible to manufacture the semiconductor device in the present fourth embodiment.

The present fourth embodiment includes two steps, that is, a step of forming the opening OP1 in the surface protective film PAS1 formed in the pad formation region and a step of forming the opening OP2 in the surface protective film PAS2. As described above, because of the existence of the two steps of forming the surface protective film PAS1 and the surface protective film PAS2, it is possible to design the configuration, in which the opening OP3 is formed in the surface protective film PAS1 formed on the top part of the guard ring TGR and no opening is formed in the surface protective film PAS2 formed over the surface protective film PAS1 in which the opening OP3 is formed, and the guard ring TGR is covered with the surface protective film PAS2 as shown in FIG. 35.

For example, as in the conventional structure shown in FIG. 1, when the opening OP1 is formed by processing the surface protective film PAS1 and the surface protective film PAS2 together, the step of processing the surface protective film PAS1 and the surface protective film PAS2 is only one. In this case, if no opening is formed in the guard ring formation region, the surface protective film PAS1 and the surface protective film PAS2 are formed so as to cover the guard ring TGR as a result. Then, no opening is formed in the surface protective film PAS1, and therefore, the boundary surface between the surface protective film PAS1 and the surface protective film PAS2 is not divided over the guard ring TGR. Because of this, with this structure, the possibility becomes high that impurities permeate the inner region of the semiconductor chip via the boundary surface between the surface protective film PAS1 and the surface protective film PAS2. However, if an opening that penetrates through the surface protective film PAS1 and the surface protective film PAS2 is formed also in the guard ring formation region, it becomes more likely that impurities permeate the inside through the opening.

In contrast to this, the present fourth embodiment includes two steps, that is, the step of forming the opening OP1 in the surface protective film PAS1 formed in the pad formation region and the step of forming the opening OP2 in the surface protective film PAS2. In the present fourth embodiment, by utilizing the existence of the two steps, it is possible to design the configuration in which the opening OP3 is formed in the surface protective film PAS1 formed on the top part of the guard ring TGR and no opening is formed in the surface protective film PAS2 formed over the surface protective film PAS1 in which the opening OP3 is formed, and the guard ring TGR is covered with the surface protective film PAS2. Because of this, according to the present fourth embodiment, it is possible to effectively suppress the permeation of impurities via the boundary surface between the surface protective film PAS1 and the surface protective film PAS2 because the boundary surface between the surface protective film PAS1 and the surface protective film PAS2 is divided over the guard ring TGR.

It is also possible to combine the technique disclosed in the present fourth embodiment with the first to third embodiments described above, and more remarkable effects can be obtained.

Fifth Embodiment

Figure 42:
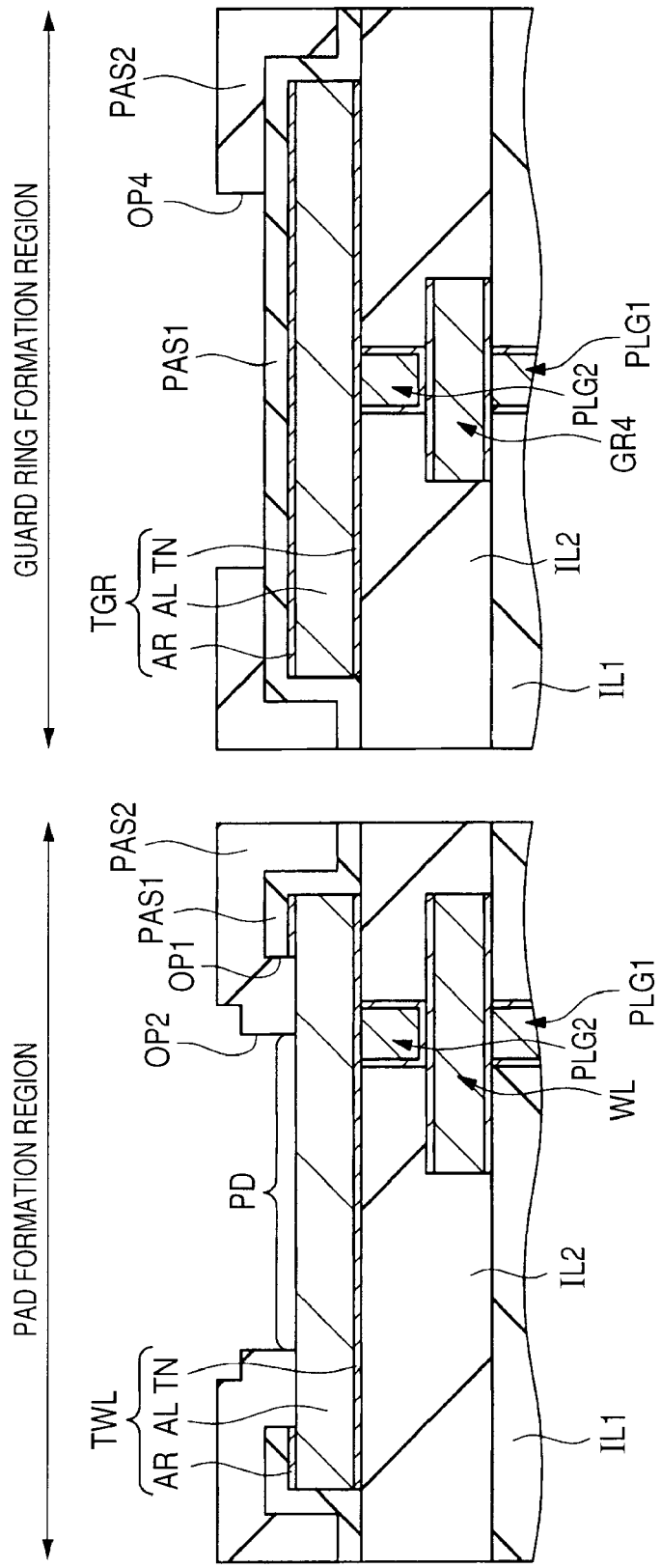
FIG. 42 is a section view showing a semiconductor device in a fifth embodiment.

FIG. 42 is section view showing a semiconductor device in a fifth embodiment. In the present fifth embodiment, the antireflection film AR and the surface protective film PAS1 in the guard ring formation region are not removed but remain and the opening OP3 is not formed in the surface protective film PAS1. Then, the surface protective film PAS2 has a structure in which an opening OP4 is formed over the guard ring TGR.

In the normal manufacturing step, the semiconductor wafer is diced into a plurality of individual semiconductor chips CHP in the dicing step. At this time, when the surface protective film PAS2 including a silicon nitride film is diced, a stress occurs in the surface protective film PAS2 and there is a possibility that trouble, such as the occurrence of a crack, occurs in the surface protective film PAS2 over the internal circuit region ICA. Because of this, it is possible to prevent the stress from the end part of the semiconductor chip CHP from propagating to the top of the internal circuit region ICA by providing the opening OP4 in the surface protective film PAS2. The opening OP4 is formed over the guard ring TGR, and this means that the opening OP4 is formed so as to surround the whole of the internal circuit region ICA.

Here, by doing so, it is possible to prevent the antireflection film AR (titanium nitride film) over the guard ring TGR from being oxidized, although the opening OP3 is not formed in the antireflection film AR and the surface protective film PAS1. That is, it is desirable to form the surface protective film PAS1 over the entire guard ring TGR.

Next, a method of manufacturing the semiconductor device in the present fifth embodiment is explained. The manufacturing steps in FIG. 36 and FIG. 37 are the same as those in the four embodiment described above. Then, in the steps in FIG. 38 and FIG. 39, the antireflection film AR and the surface protective film PAS1 are not etched and left as is. After that, as shown in FIG. 40, the surface protective film PAS2 is formed and the opening OP4 can be formed in the same step of forming the opening OP2 in FIG. 41.

It is also possible to combine the technique explained in FIG. 42 in the fifth embodiment with the first to third embodiments described above and more remarkable effects can be obtained.

Figure 43:
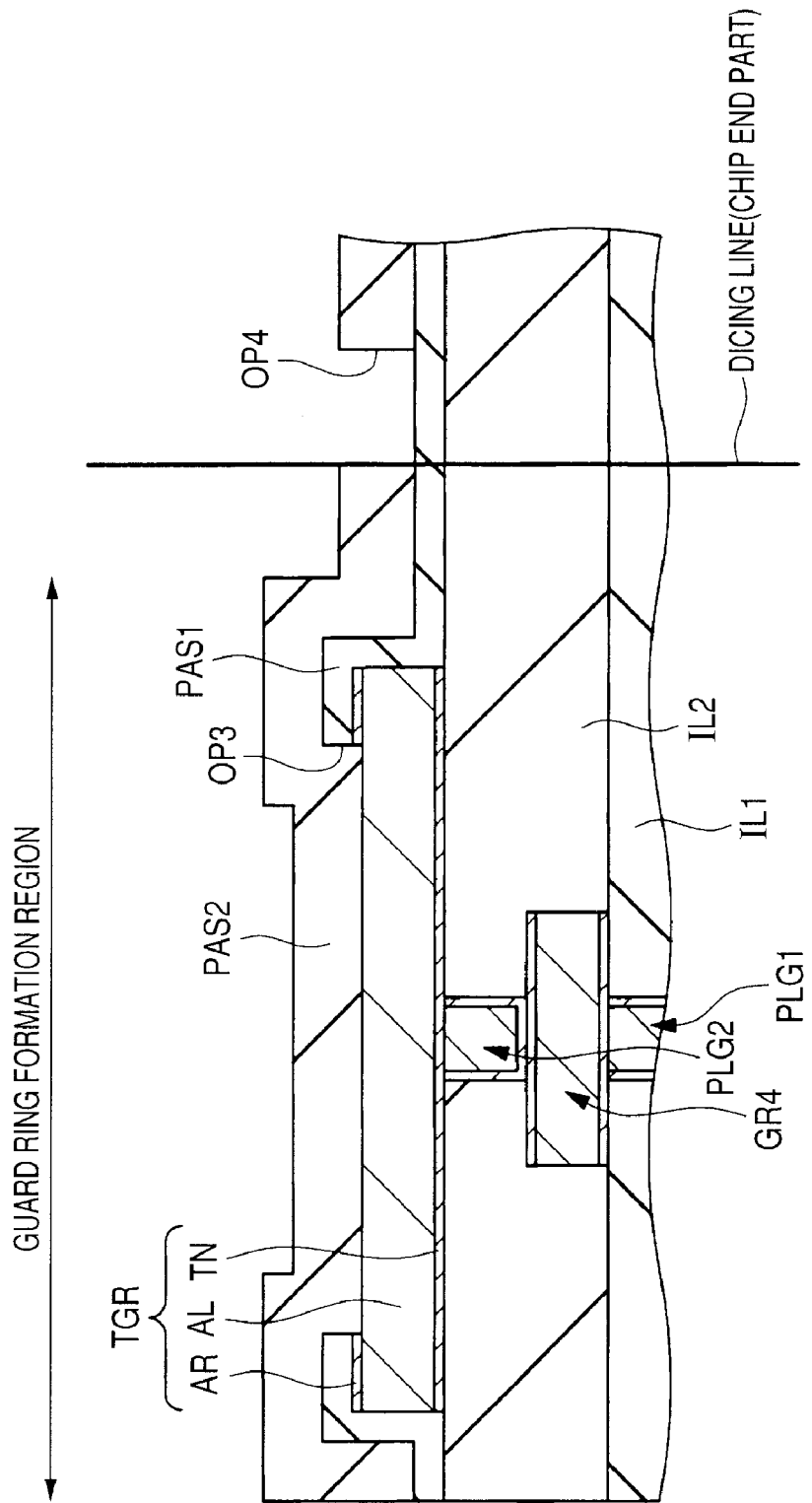
FIG. 43 is a section view showing a semiconductor device in a modified example of the fifth embodiment.

Next, FIG. 43 is a section view showing a semiconductor device, which is a modified example of the present fifth embodiment. In the modified example, the structure of the guard ring formation region is the same as that in the fourth embodiment described above, and the structure of the surface protective film PAS2 between the guard ring formation region and the end part of the semiconductor chip CHP is made similar to the structure as shown in FIG. 43. That is, as shown in FIG. 43, between the guard ring formation region and the end part (dicing line) of the semiconductor chip CHP, the surface protective film PAS1 is formed and in the surface protective film PAS2 thereover, the opening OP4 is formed. With such a structure, it is possible to effectively prevent the occurrence of a crack in the surface protective film PAS2 in the dicing step as well as suppressing the permeation of impurities via the boundary surface between the surface protective film PAS1 and the surface protective film PAS2 in the guard ring formation region. The method of manufacturing the semiconductor device in the modified example can be performed in the same manner as the manufacturing step shown in FIG. 42 described above.

In this modified example, there is no wire structure, such as the guard ring TGR, under the surface protective film PAS1, and therefore, the opening OP3 may be formed also in the surface protective film PAS1. In that case, the position of the opening OP4 in the surface protective film PAS2 may be inside or outside the opening OP3 in the surface protective film PAS1. A manufacturing method in that case is shown below. The manufacturing steps up to those in FIG. 36 and FIG. 37 are the same as those in the fourth embodiment described above. Then, in the steps in FIG. 38 and FIG. 39, the surface protective film PAS1 is etched and the opening OP3 is formed. After that, as shown in FIG. 40, the surface protective film PAS2 is formed and in the same step as that in which the opening OP2 is formed as shown in FIG. 41, the opening OP4 can be formed.

It is also possible to combine the technique explained in FIG. 43, which shows a modified example, with the first to fourth embodiments described above and more remarkable effects can be obtained.

Sixth Embodiment

In a sixth embodiment, an example is explained, in which the size of an opening formed in a probe contact region to which a probe is contacted of the surface region of the pad PD is made to differ from the size of an opening formed in a wire connection region to which a wire is connected.

FIG. 6 is a diagram showing an example of the surface region of the pad PD explained in the first embodiment described above. As shown in FIG. 6, in the surface region of the pad PD, the probe contact region PRO to which a probe is contacted in the electrical characteristic inspection and the wire connection region PDR to which a wire is connected in the wire bonding step exist. For such a pad PD, the opening OP1 and the opening OP2 as shown in the first to fourth embodiment described above are formed (refer to FIG. 8, FIG. 26 or FIG. 29). At this time, the size (diameter) of the opening OP2 that is exposed in the probe contact region PRO is the same as the size (diameter) of the opening OP2 that is exposed in the wire connection region PDR.

Here, as a result of the discussion of the inventors of the present invention, it has been newly found that there is a correlation between a distance X from the end part of the uppermost layer wire TWL to the side surface of the opening OP2 in FIG. 29 (the length of the region of the uppermost layer wire TWL covered with the surface protective film PAS1 and the surface protective film PAS2) and a crack that occurs when part of the wire W is stranded on the surface protective film PAS1, for example, as explained in the third embodiment described above. Specifically, it has been found that the longer the distance X, the more the occurrence of a cracker tends to be suppressed.

Therefore, based on this knowledge, the inventors of the present invention have devised the configuration of the pad PD. The configuration of the pad PD in the present sixth embodiment, which has been devised, is explained below. The technique to be explained in the present sixth embodiment is not limited to the structure explained in the third embodiment described above (FIG. 29) but can also be applied to the other embodiments (for example, FIG. 8 or FIG. 26).

Figure 44:
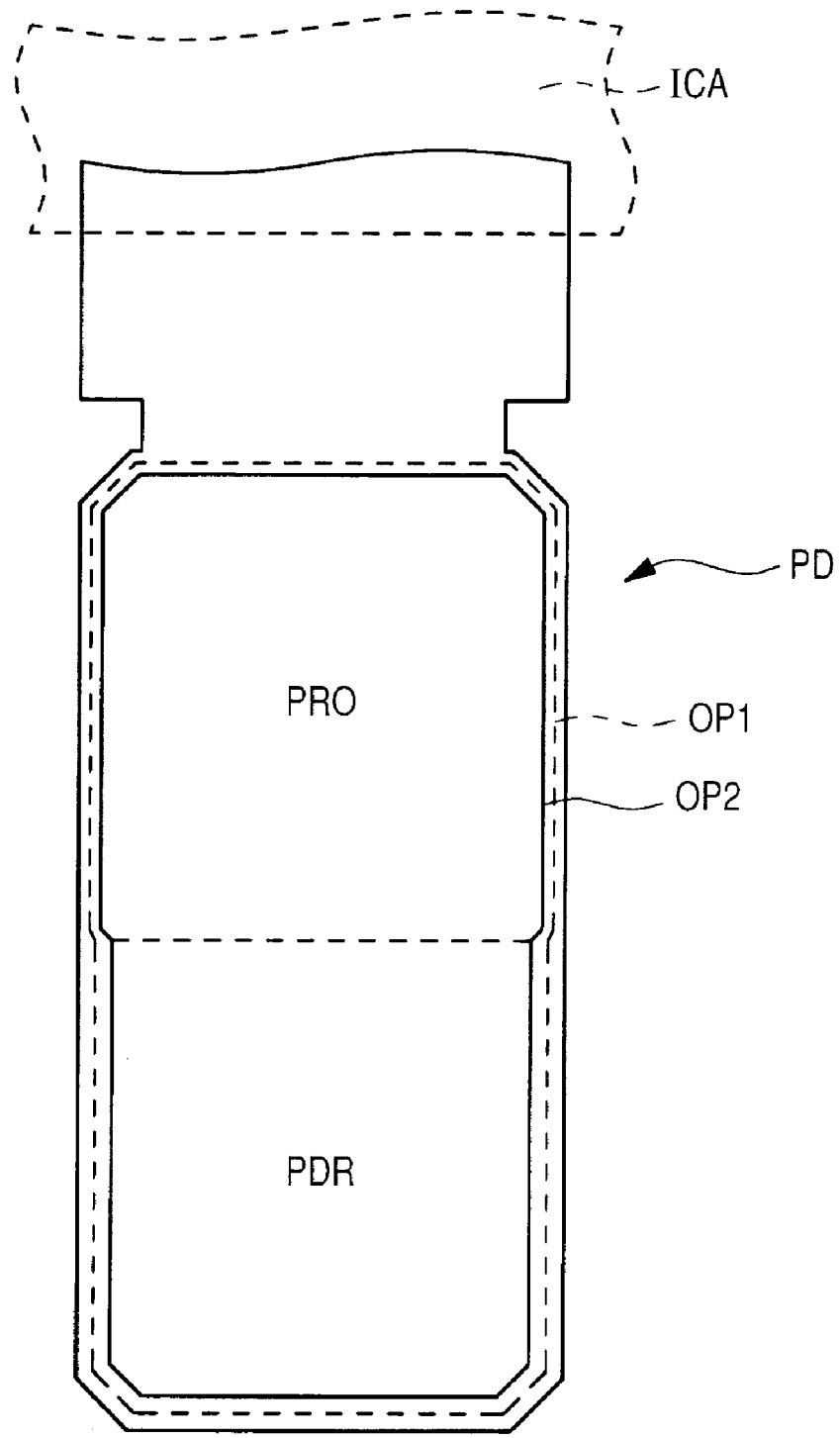
FIG. 44 is a diagram showing a configuration of a pad in a sixth embodiment.

FIG. 44 is a diagram showing the surface region of the pad PD in the present sixth embodiment. In FIG. 44, in the surface region of the pad PD, the probe contact region PRO and the wire connection region PDR exist as in FIG. 6. Then, the characteristic of the present sixth embodiment is that the size (diameter) of the opening OP2 that is exposed in the wire connection region PDR is made smaller than the size (diameter) of the opening OP2 that is exposed in the probe contact region PRO. That is, the present sixth embodiment is characterized in that the exposure area of the wire connection region PDR is made smaller than the exposure area of the probe contact region PRO.

Due to this, in the wire connection region PDR, the distance X shown in FIG. 29 becomes greater. In other words, the length from the opening OP1 to the opening OP2 in the wire connection region PDR is made greater than the length from the opening OP1 to the opening OP2 in the probe contact region PRO. That is, the area in which the surface protective film PAS2 in the wire connection region PDR is in contact with the aluminum film AL is smaller than the area in which the surface protective film PAS2 in the probe contact region PRO is in contact with the aluminum film AL. As a result of that, it is possible to suppress the occurrence of a crack even if part of the wire W bulges out from the wire connection region PDR and is stranded on the surface protective film PAS2.

Because of this, it can be conceived of that the exposure area of the probe contact region PRO is made smaller as well as that of the wire connection region PDR. However, it is necessary to securely contact a probe to the pad PD in the probe contact region PRO in order to conduct an electrical characteristic inspection of high reliability. That is, if the exposure area of the probe contact region PRO is made smaller than necessary, the contact area of the probe is made smaller and there is a possibility that an electrical characteristic inspection of high reliability cannot be conducted. Because of this, in the present sixth embodiment, only the exposure area of the wire connection region PDR is made as small as possible while keeping the same the size of the probe contact region PRO. Due to this, remarkable effects can be obtained that it is possible to suppress the occurrence of a crack due to the positional shift of the wire W as well as ensuring the reliability of an electrical characteristic inspection using a probe.

The semiconductor device in the present sixth embodiment is configured as described above and the method of manufacturing the same is substantially the same as the method of manufacturing the semiconductor device in the first to fifth embodiments described above. The point of difference is that the patterning of the opening OP1 and the opening OP2 is processed and changed somewhat so that the exposure area of the wire connection region PDR in the pad PD is smaller than the exposure area of the probe contact region PRO in the pad PD. In the manner described above, it is possible to manufacture the semiconductor device in the present sixth embodiment.

Seventh Embodiment

A seventh embodiment differs from the first to sixth embodiments described above in that an antireflection insulating film ARI is formed on the surface of the antireflection film AR (titanium nitride film). The points of difference from the first embodiment described above are explained below by comparison.

Figure 45:
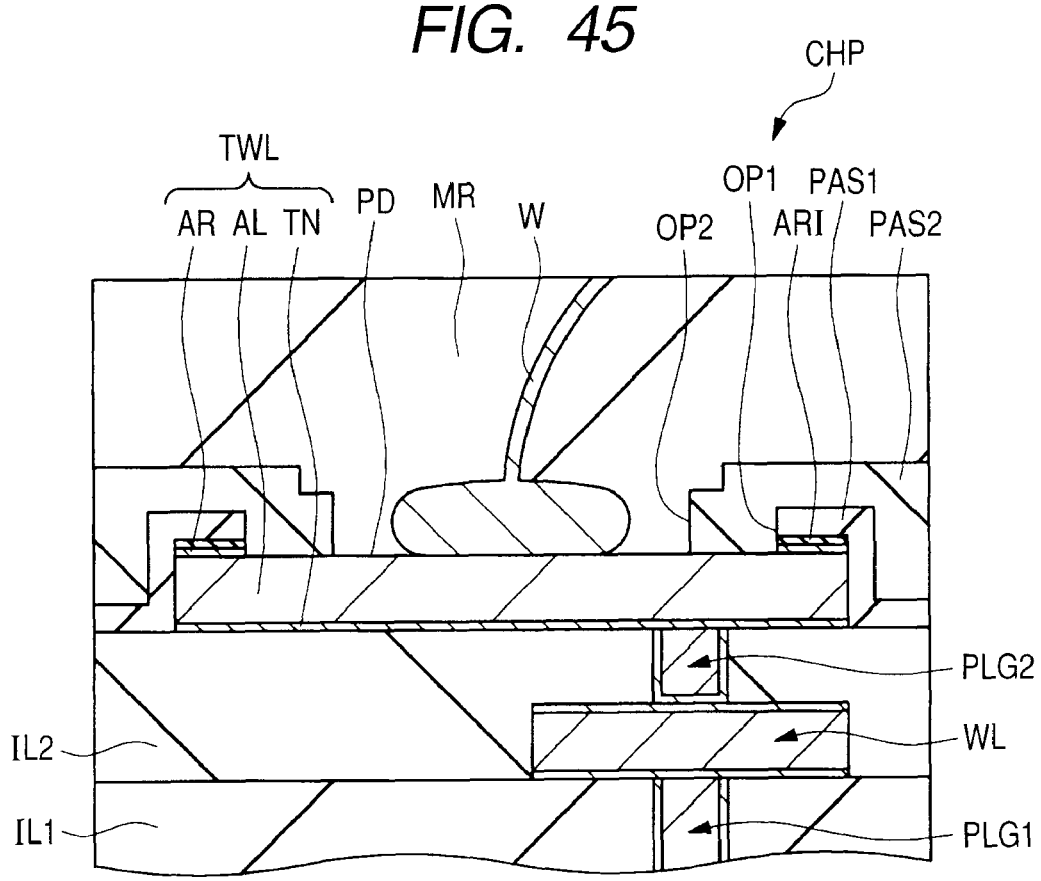
FIG. 45 is a section view showing a semiconductor device in a seventh embodiment.

FIG. 45 shows a semiconductor device in the present seventh embodiment. The antireflection insulating film ARI includes, for example, a silicon oxynitride film (SiON) and comprises the antireflection function at the time of formation of a resist mask like the antireflection film AR.

Such an antireflection insulating film ARI exhibits its effect when a titanium nitride film, which is the antireflection film AR, is formed thin, for example, as thin as 30 nm or less. When the titanium nitride film AR is made thin, there is an advantage that the amount of expansion of the volume is small even when it chemically reacts with water and the titanium oxide film TOX is formed. However, if the antireflection film AR is made thin, there is a possibility that the surface of the aluminum film AL is affected adversely when a resist material is applied onto the antireflection film AR and the material permeates the antireflection film AR and reaches its backing, that is, the aluminum film AL. Because of this, the antireflection insulating film ARI is formed as a film having a function of preventing the permeation of a resist material as well as a function of preventing reflection. Due to this, the reliability of the semiconductor device can be further improved. The film thickness of the antireflection insulating film ARI is about 30 to 50 nm and it is desirable to form the antireflection insulating film ARI thicker so that the film thickness thereof is greater than that of the antireflection film AR.

Further, it may also be possible to form only the antireflection insulating film ARI without forming the antireflection film AR. In that case, there is an effect that the titanium oxide film TOX is no longer formed.

Furthermore, in the present seventh embodiment, as a material of the antireflection insulating film ARI, a silicon oxynitride film is shown as an example, however, the antireflection insulating film ARI can be formed by other materials, such as silicon carbonitride film (SiCN), as long as they have the above-mentioned functions.

The antireflection insulating film ARI can be formed over the antireflection film AR when the antireflection film AR is formed in FIG. 10. After that, as shown in FIG. 14, the antireflection insulating film ARI and the antireflection film AR that are exposed from the opening OP1 are removed. The subsequent steps are the same as those in the first embodiment described above, and therefore, their explanation is omitted.

It is also possible to combine the technique disclosed in the present seventh embodiment with the first to sixth embodiments described above and more remarkable effects can be obtained.

As above, the invention made by the inventors of the present invention is explained based on the specific embodiments, however, the present invention is not limited to the embodiments and it is obvious that there can also be various modified examples without deviating from the scope of the gist of the present invention. It may also be possible to combine the first to seventh embodiments described above.

For example, in the first to seventh embodiments, the example is disclosed in which the wire is connected to the pad PD, however, a bump electrode including gold or solder can be formed. In that case, the bump electrode is formed in the wire connection region PDR. Further, it is desirable for the aspect of a package that uses the bump electrode to be such that the wire connection region PDR is closer to the internal circuit region ICA in view of the resistance delay with respect to the internal circuit region ICA. That is, when the bump electrode is formed, the positions of the wire connection region PDR and the probe contact region PRO shown in FIG. 6 and FIG. 44 are opposite.

Furthermore, as the surface protective film PAS2, a silicon nitride film is disclosed, however, the surface protective film PAS2 may be formed by a silicon oxynitride film, as another material.

Still furthermore, it is obvious that the present invention disclosed in the present first to seventh embodiment exhibits its effects even when the halogen-free material is not used.

The present invention is widely used in the manufacturing industry that manufactures semiconductor devices.

What is claimed is:
1. A semiconductor device,
wherein a semiconductor substrate has a wire formation region and a guard ring formation region,
wherein there are formed in the wire formation region:
(a1) a first pad formed in an upper layer of the semiconductor substrate;
(b1) a first surface protective film in which a first opening is formed over the first pad; and
(c1) a second surface protective film in which a second opening is formed over the first pad and which is formed over the first pad and the first surface protective film,
wherein the first pad has:
(a11) a first conductive film; and
(a12) an antireflection film formed over the first conductive film,
wherein the second opening is included in an inner region of the first opening,
wherein the antireflection film is removed in the inner region of the first opening,
wherein there are formed in the guard ring formation region:
(a2) a second pad formed in an upper layer of the semiconductor substrate;
(b2) the first surface protective film in which a third opening is formed over the second pad; and
(c2) the second surface protective film in which the third opening is embedded and which is formed over the second pad and the first surface protective film,
wherein the second pad has:
(a21) the first conductive film; and
(a22) the antireflection film formed over the first conductive film, and
wherein the antireflection film is removed in an inner region of the third opening.
2. The semiconductor device according to claim 1, further comprising a resin member formed over the second surface protective film including the inside of the second opening,
wherein the resin member includes a halogen-free member.

3. The semiconductor device according to claim 1,
wherein a fourth opening is provided in the second surface protective film so as to surround the guard ring formation region in a region between the guard ring formation region and the end part of the semiconductor substrate.

4. A semiconductor device comprising:
(a) a pad formed in an upper layer of a semiconductor substrate;
(b) a first surface protective film in which a first opening is formed over the pad; and
(c) a second surface protective film in which a second opening is formed over the pad and which is formed over the pad and the first surface protective film,
wherein the pad has:
(a1) a first conductive film; and
(a2) an antireflection film formed over the first conductive film,
wherein the second opening is included in an inner region of the first opening,
wherein the antireflection film is removed in the inner region of the first opening,
wherein there exist in the pad a probe contact region to which a probe is contacted and a wire connection region to which a wire is connected,
wherein the first opening and the second opening are formed so as to extend from the probe contact region to the wire connection region, and
wherein the size of the second opening in the wire connection region is smaller than the size of the second opening in the probe contact region.

5. The semiconductor device according to claim 4, comprising a resin member formed over the second surface protective film including the inside of the second opening,
wherein the resin member includes a halogen-free member.

6. The semiconductor device according to claim 4,
wherein the probe contact region is a region more distant from the end part of the semiconductor substrate than the wire connection region.

7. The semiconductor device according to claim 4,
wherein an antireflection insulating film is formed between the antireflection film and the first surface protective film.

8. A semiconductor device,
wherein a semiconductor substrate has a wire formation region and a guard ring formation region,
wherein there are formed in the wire formation region:
(a1) a first pad formed in an upper layer of the semiconductor substrate;
(b1) a first surface protective film in which a first opening is formed over the first pad; and
(c1) a second surface protective film in which a second opening is formed over the first pad and which is formed over the first pad and the first surface protective film,
wherein the first pad has:
(a11) a first conductive film; and
(a12) an antireflection film formed over the first conductive film,
wherein the second opening is included in an inner region of the first opening,
wherein the antireflection film is removed in the inner region of the first opening,
wherein there are formed in the guard ring formation region:
(a2) a second pad formed in an upper layer of the semiconductor substrate;
(b2) the first surface protective film formed over the second pad; and
(c2) the second surface protective film formed over the first surface protective film and which has a fourth opening, and
wherein the second pad has:
(a21) the first conductive film; and
(a22) the antireflection film formed over the first conductive film.

\* \* \* \* \*